(12) United States Patent
Haga

(10) Patent No.: US 6,816,419 B2
(45) Date of Patent: Nov. 9, 2004

(54) SEMICONDUCTOR DEVICE HAVING A REDUNDANT MEMORY CELL AND METHOD FOR RECOVERING THE SAME

(75) Inventor: Ryo Haga, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 81 days.

(21) Appl. No.: 10/289,987

(22) Filed: Nov. 7, 2002

(65) Prior Publication Data

US 2004/0047192 A1 Mar. 11, 2004

(30) Foreign Application Priority Data

Sep. 11, 2002 (JP) ........................................ 2002-265920

(51) Int. Cl.$^7$ ................................................. G11C 7/00
(52) U.S. Cl. ....................................... 365/200; 365/201
(58) Field of Search ................................ 365/200, 201, 365/189.05, 189.07

(56) References Cited

U.S. PATENT DOCUMENTS

| | | | | |
|---|---|---|---|---|
| 5,426,607 A | * | 6/1995 | Ishibashi | 365/200 |
| 6,055,611 A | | 4/2000 | Wright et al. | 711/162 |
| 6,144,592 A | * | 11/2000 | Kanda | 365/200 |
| 6,501,693 B2 | * | 12/2002 | Takatsuka et al. | 365/201 |
| 6,597,607 B2 | * | 7/2003 | Koshita | 365/200 |

FOREIGN PATENT DOCUMENTS

JP  5-54692  3/1993

\* cited by examiner

*Primary Examiner*—Anh Phung
(74) *Attorney, Agent, or Firm*—Frommer Lawrence & Haug LLP

(57) ABSTRACT

A semiconductor device includes a prime memory cell array, a redundant memory cell array, a holding circuit, a group of access lines, and first and second controlling circuits. The prime memory cell array includes prime memory cells. The redundant memory cell array includes redundant memory cells. The holding circuit holds an address of a defective memory cell. The access lines are respectively connected to the redundant memory cells. The first controlling circuit supplies a substitution command to substitute a redundant memory cell for the defective memory cell corresponding to the address held in the holding circuit, through the group of access lines to the defective memory cell. The second controlling circuit, when a plurality of portions of the holding circuit holds the address of the defective memory cell, disables all but one of the plurality of portions which hold the address of the defective memory cell.

16 Claims, 31 Drawing Sheets

SEMICONDUCTOR DEVICE HAVING A REDUNDANT MEMORY CELL AND METHOD FOR RECOVERING THE SAME

CROSS-REFERENCE TO RELATED APPLICATIONS

This application is based upon and claims the benefit of priority from the prior Japanese Patent Applications No. 2002-265920, filed Sep. 11, 2002, the entire contents of which are incorporated herein by reference.

BACKGROUND OF THE INVENTION

1. Field of the Invention

The present invention relates to a semiconductor device and a method for recovering the same, and more particularly to a redundancy technique.

2. Description of the Related Art

In recent years, a redundancy technique is widely used in semiconductor devices, such as semiconductor memory devices in particular, in order to improve the manufacturing yield. The redundancy technique means a technique of adding redundant elements to prime elements (e.g., word lines, column lines or I/O lines). If one of the prime elements has a defect, the defective element is replaced with a redundant element, so that the defect can be remedied. The term "redundancy" originally means duplication or repetition of elements. However, as the technique for replacing a defective portion with a redundant line (or a redundant memory cell) is generalized, the replacement itself has come to be called "redundancy technique". Therefore, in this specification, the term "redundancy" means "recovery of the semiconductor device including a defective portion by use of a redundant line or redundant memory cell".

The conventional redundancy technique will be described with reference to FIGS. 1A and 1B. FIGS. 1A and 1B are schematic diagrams showing a word line redundancy system in a conventional DRAM (Dynamic Random Access Memory). FIG. 1A shows a case in which the word line has no defect, while FIG. 1B shows a case in which the word line has a defect.

When a row address and a word line select command are input to a row control circuit 100 from outside, a redundancy control circuit 200 compares the input row address with redundancy information. The redundancy information means the address of a defective word line. The redundancy information is stored in a fuse, a latch or the like during a memory test time. Access to the memory is performed so as to avoid a defective portion by virtue of the redundancy information.

If the redundancy information does not match with the row address, the redundancy control circuit 200 determines that replacement of the word line is unnecessary. Accordingly, a row decoder 300 selects a word line for normal access (prime word line) (see FIG. 1A). If the redundancy information matches with the row address, the redundancy control circuit 200 determines that replacement of the word line is necessary. Accordingly, the row decoder 300 selects a redundant word line in place of the prime word line (see FIG. 1B).

FIG. 2 is a block diagram of the redundancy control circuit 200 and the row decoder 300.

The row decoder 300 has prime word line drivers 310 for the respective prime word lines, and redundant word line drivers 320 for the respective redundant word lines. Each of the prime word line drivers 310 activates the corresponding prime word line, and each of the redundant word line drivers 320 activates the corresponding redundant word line.

The redundancy control circuit 200 has redundancy information storing circuits 210 and a NOR gate 220. Each of the storing circuits 210 is connected to the corresponding redundant word line and stores redundancy information. In the example shown in FIG. 2, the respective storing circuits 210 replace the prime word line 5 with the redundant word line 0, the prime word line 26 with the redundant word line 1, the prime word line 116 with the redundant word line 2, and the prime word line 473 with the redundant word line 3. Assume that, for example, the row address "5" is input. The row address is compared to all redundancy information. In the example shown in FIG. 2, the row address "5" matches with the redundancy information "5" corresponding to the redundant word line 0. In this case, the output of the redundancy match line corresponding to the redundant word line 0 is set to "H" level. As a result, the redundant word line driver 320 activates the redundant word line 0. The NOR gate 220 carries out the logical OR among the outputs of all redundancy match lines. The result of the logical OR operation is input to the prime word line drivers 310 through a prime word line non-select line NSL. In the example shown in FIG. 2, if the output of any redundancy match line is at "H" level, the prime word line non-select line NSL is set to "L" level. In this case, the prime word line drivers 310 do not activate the prime word lines. Therefore, only the cells connected to the redundant word lines can be accessed.

FIG. 3 is a circuit diagram showing a structure of the redundancy information storing circuit 210. Although FIG. 3 shows details of only the circuit corresponding to the redundant word line 0, all of the circuits corresponding to the other redundant word lines have the same structure.

The redundancy information is held in a node a1 of a latch 211 in every bit. For example, in the case of a 9-bit row address, each of bits RA0 to RA8 is compared to the bit of the redundancy information held in each latch 211 by a comparing circuit 212. If the row address matches with the redundancy information, the comparing circuit 212 outputs an "H" level signal. Information held in a latch 213 determines whether to use the redundancy information held in the redundancy information storing circuit 210. For example, if the node b1 of the latch is at the "H" level, the redundancy information is used. The latch outputs an "H" level signal. An AND gate 214 carries out the logical AND among the outputs of the comparing circuits 212 and the output of the latch 213. The result of the logical AND operation is output to the redundancy match line. Thus, if all bits of the row address match with all bits of the redundancy information and the latch 213 holds the "H" level, the "H" level signal appears in the redundancy match line. Then, the redundant word line corresponding to the redundancy match line is selected. In this case, the output of the NOR gate 220 is at "L" level. Accordingly, the prime word line is in the non-select state as described above.

The conventional structure described above has the following problem: that is, even if a redundant word line is substituted for a prime word line, if the redundant word line has a defect, it is very difficult to recover the redundant word line. FIG. 4 shows this state.

In the example shown in FIG. 4, a redundant word line r0 is substituted for a prime word line p5 having a defect. However, the redundant word line r0 also has a defect. Since it is very difficult to recover the redundant word line r0, the chip including these lines is determined to be defective.

In the case described above, it is necessary to substitute another redundant word line for the defective redundant word line. This technique is disclosed in, for example, Jpn. Pat. Appln. KOKAI Publication No. 5-54692, paragraphs [0013]-[0017], etc. FIGS. 5A and 5B are schematic diagrams of a redundancy system according to a first embodiment the invention disclosed in Jpn. Pat. Appln. KOKAI Publication No. 5-54692. According to this system, each of resubstitution circuits 405a and 405b must have two fuses in order to re-substitute a redundant word line. Therefore, the system has the drawback that the chip has a large area.

Further, Jpn. Pat. Appln. KOKAI Publication No. 5-54692, paragraphs [0018]-[0022], describes a second embodiment, in which no fuse for re-substitution is used. FIG. 6A is a schematic diagram of a redundancy system according to the second embodiment described in Jpn. Pat. Appln. KOKAI Publication No. 5-54692.

According to this system, a spare select line decoder receives an input signal/SDE from an adjacent spare select line decoder. It does not operate if the input signal/SDE is at "H" level. Therefore, selection of both spare select lines L5 and L6 can be prevented. In this system, the signal/SDE is always input to the adjacent spare select line decoder. The substitution is carried out as shown in FIG. 6B. First, when "one" defect is found in a test, the test is interrupted. Then, the spare select line L5 is substituted for the defective memory cell. Subsequently, the spare select line L5 is tested. If no defect is found, the test is restarted from the interrupted point. If there is a defect in the spare select line L5, the spare select line L6 is substituted for the spare select line 5. Thereafter, the spare select line L6 is tested. If a defect is found, the chip is determined to be a defective chip. On the other hand, if there is no defect in the spare select line L6, the test is restarted from the portion interrupted first. If there is no defect in the overall chip, the chip is determined to be a conforming chip.

However, the above system has the following problem. FIG. 6C shows a structure having three spare select lines. An input signal/SDE5 is a control signal for a spare select line decoder 408a connected to the spare select line L5. When the input signal/SDE5 is "L", the spare select line decoder 408a sets the spare select line L5 to the non-select state. An input signal/SDE6 is a control signal for a spare select line decoder 408b connected to the spare select line L6. When the input signal/SDE6 is "L", the spare select line decoder 408b sets the spare select line L6 to the non-select state.

FIG. 6D shows steps of testing the structure shown in FIG. 6C. It is assumed that two test steps are performed and a defective memory cell is replaced in each test step. In the example shown in FIG. 6D, two defects are found in the first test. The defective memory cells are replaced by spare select lines L5 and L6. Thus, the first test is completed.

Then, all cells are tested again. It is assumed that further defects are found in this step. In the example shown in FIG. 6D, defects occur in two types of portions: one in a prime cell, and the other in the spare select line L5. In the former case, the spare select line L7 is substituted for the prime cell, so that the defect can be remedied. In the latter case, the spare select line L7 can be substituted for the spare select line L5; however, there is no means for stopping selection of the spare select line L5. Therefore, in the case where the spare select line L7 is substituted for the spare select line L5, it is difficult to prevent multi-selection of cells. More specifically, if a cell corresponding to the spare select line L5 is to be accessed, only the spare select line L7 should be accessed in theory. In practice, however, according to the conventional structure, not only the spare select line L7 but also the spare select line L5, which includes a defect, is accessed.

BRIEF SUMMARY OF THE INVENTION

A semiconductor device according to an aspect of the present invention comprises:
- a prime memory cell array including prime memory cells arranged in a matrix;
- a redundant memory cell array including redundant memory cells arranged in a matrix;
- a holding circuit which holds an address of a defective memory cell included in the prime memory cell array;
- a group of access lines respectively connected to the redundant memory cells;
- a first controlling circuit which supplies a substitution command to substitute a redundant memory cell for the defective memory cell corresponding to the address held in the holding circuit, through the group of access lines to the defective memory cell; and
- a second controlling circuit which, when a plurality of portions of the holding circuit hold the address of the defective memory cell, disables all but one of the plurality of portions which hold the address of the defective memory cell.

A method for recovering a semiconductor device according to an aspect of the present invention comprises:
- carrying out a first test with respect to prime memory cells included in a prime memory cell array to detect a first defective memory cell;
- substituting a first redundant memory cell included in a first redundant memory cell group of a redundant memory cell array for the first defective memory cell detected in the first test;
- carrying out a second test with respect to all prime memory cells included in the prime memory cell array except the first defective memory cell and the first redundant memory cell substituted for the first defective memory cell to detect a second defective memory cell;
- substituting a second redundant memory cell included in a second redundant memory cell group of the redundant memory cell array for the second defective memory cell detected in the second test; and
- inhibiting access to the first defective memory cell and the first redundant memory cell, when the second defective memory cell is the first redundant memory cell substituted for the first defective memory cell.

DETAILED DESCRIPTION OF THE INVENTION

Figure 7A:
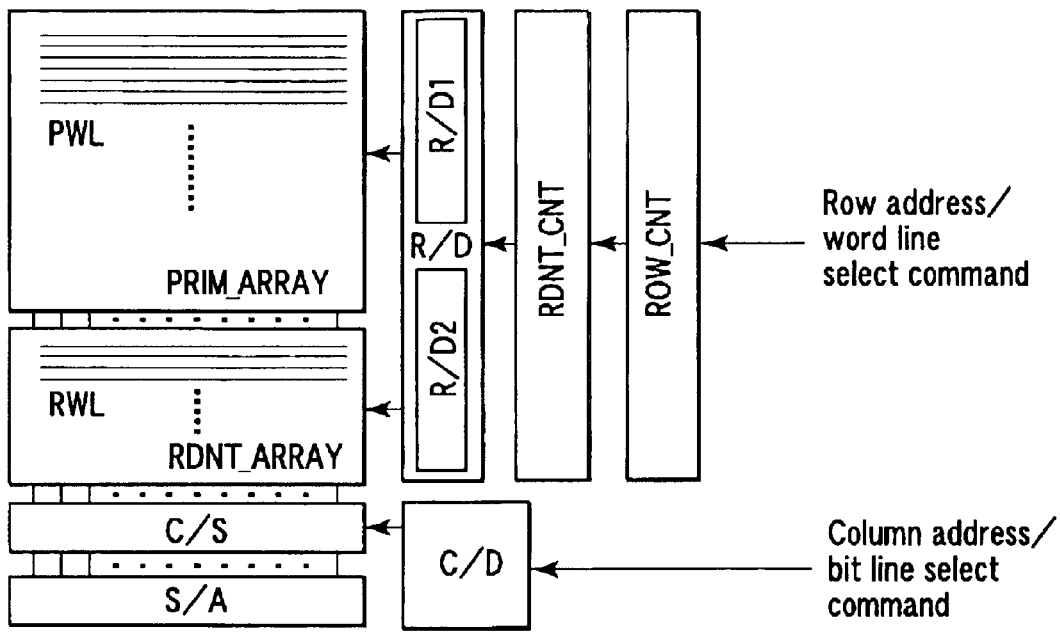
FIG. 7A is a block diagram showing a semiconductor device according to a first embodiment of the present invention.

A semiconductor device according to a first embodiment of the present invention will be described with reference to FIG. 7A. FIG. 7A is a block diagram showing a semiconductor memory device according to the first embodiment.

As shown in FIG. 7A, the semiconductor memory device 1 comprises a prime memory cell array PRIM_ARRAY, a redundant memory cell array RDNT_ARRAY, a row control circuit ROW_CNT, a redundancy control circuit RDNT_CNT, a row decoder R/D, a column decoder C/D, a column selector C/S and a sense amplifier S/A.

The prime memory cell array PRIM_ARRAY includes a plurality of prime memory cells arranged in a matrix. The prime memory cells in the same row are connected to a common prime word line PWL. The prime memory cells in the same column are connected to a common bit line.

The redundant memory cell array RDNT_ARRAY includes a plurality of redundant memory cells arranged in a matrix. A redundant memory cell is to be substituted for a defective memory cell. The redundant memory cells in the same row are connected to any one of redundant word lines RWL in common. The redundant memory cells in the same column are connected to a common bit line.

The row control circuit ROW_CNT receives a row address and a word line select command from an external device and supplies the row address to the redundancy control circuit RDNT_CNT.

The redundancy control circuit RDNT_CNT determines whether a redundant memory cell should be substituted for a prime memory cell based on the row address supplied from the row control circuit ROW_CNT.

The row decoder R/D includes a first row decoder R/D1 and a second row decoder R/D2. The first row decoder R/D1 operates when the redundancy control circuit RDNT_CNT determines that a redundant memory cell should not be substituted for a prime memory cell. It selects one of the prime word lines PWL in the prime memory cell array PRIM_ARRAY based on the input row address. The second row decoder R/D2 operates when the redundancy control circuit RDNT_CNT determines that a redundant memory cell should be substituted for a prime memory cell. It selects one of the redundant word lines RWL in the redundant memory cell array RDNT_ARRAY based on a command from the redundancy control circuit RDNT_CNT.

The column decoder C/D operates in response to a column address and a bit line select command externally supplied. It decodes the column address and supplies a column decode signal to the column selector C/S.

The column selector C/S selects a bit line from the prime memory cell array PRIM_ARRAY and the redundant memory cell array RDNT_ARRAY based on the column decode signal supplied from the column decoder C/D.

The sense amplifier S/A amplifies data read from the prime memory cell or redundant memory cell selected by the row decoder R/D and the column selector C/S.

Figure 7B:
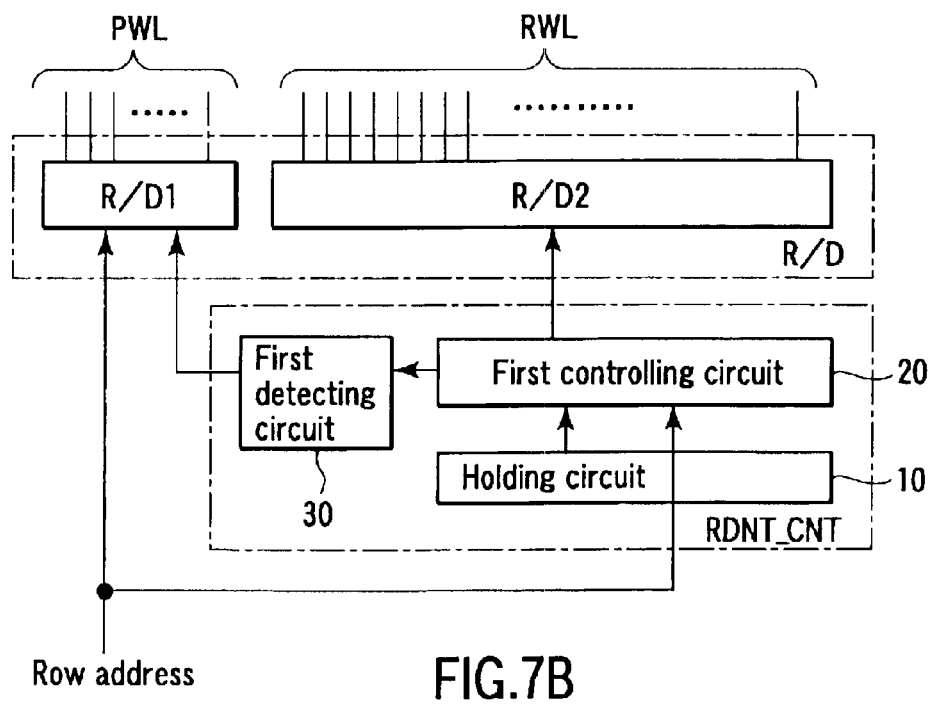
FIG. 7B is a block diagram showing a row decoder and a redundancy control circuit of the semiconductor device according to the first embodiment of the present invention.

FIG. 7B is a block diagram showing the row decoder R/D and the redundancy control circuit RDNT_CNT, which illustrates details of the redundancy control circuit RDNT_CNT in particular.

As shown in FIG. 7B, the prime word lines PWL and redundant word lines RWL are connected to the row decoders R/D1 and R/D2.

The redundancy control circuit RDNT_CNT comprises a holding circuit 10, a first controlling circuit 20 and a first detecting circuit 30. The holding circuit 10 holds redundancy information. More specifically, it holds the row address of a defective memory cell (hereinafter referred to as a defective address) contained in the prime memory cell array PRIM_ARRAY.

The first controlling circuit 20 supplies a substitution command, for substituting a redundant memory cell for a defective memory cell, to the row decoder R/D2 based on the externally input row address and the defective address held in the holding circuit 10.

The first detecting circuit 30 disables the row decoder R/D1 which selects a prime word line PWL in the prime memory cell array PRIM_ARRAY, when the first controlling circuit 20 outputs a substitution command to substitute a redundant memory cell for a defective memory cell.

Figure 7C:
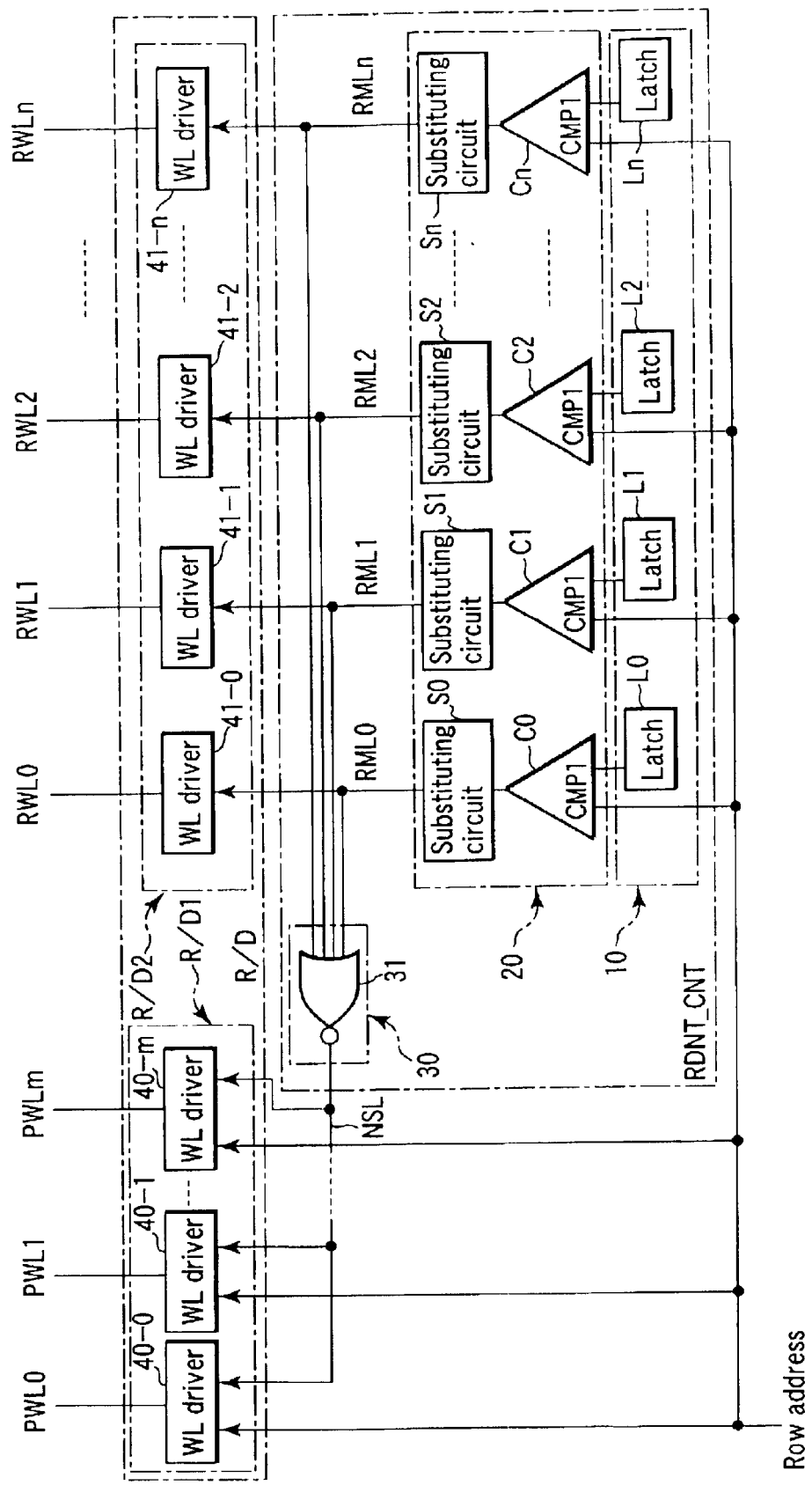
FIG. 7C is a circuit diagram showing the row decoder and the redundancy control circuit of the semiconductor device according to the first embodiment.

FIG. 7C is a circuit diagram showing the row decoder R/D and the redundancy control circuit RDNT_CNT, which illustrates the structures of the row decoder R/D and the redundancy control circuit RDNT_CNT in more detail.

As shown in FIG. 7C, the prime memory cell array PRIM_ARRAY includes (m+1) prime word lines PWL0 to PWLm, and the redundant memory cell array RDNT_ARRAY includes (n+1) redundant word lines RWL0 to RWLn.

The structure of the row decoder R/D will be described first. The row decoder R/D1 comprises (m+1) prime word line drivers 40-0 to 40-$m$. The prime word line drivers 40-0 to 40-$m$ respectively activate the prime word lines PWL0 to PWLm. The row decoder R/D2 comprises (n+1) redundant word line drivers 41-0 to 41-$n$. The redundant word line drivers 41-0 to 41-$n$ respectively activate the redundant word lines RWL0 to RWLn.

The structure of the redundancy control circuit RDNT_CNT will now be described. The holding circuit 10 comprises (n+1) latch circuits L0 to Ln. Each of the latch circuits L0 to Ln holds the row address (defective address) of a defective memory cell in the prime memory cell array PRIM_ARRAY. The latch circuits L0 to Ln are provided in correspondence with the redundant word lines RWL0 to RWLn, respectively. Therefore, the prime word lines PWL corresponding to the defective addresses held in the latch circuits L0 to Ln can be respectively replaced by the redundant word line RWL0 to RWLn.

The first controlling circuit 20 comprises (n+1) first comparing circuit C0 to Cn and (n+1) substituting circuits S0 to Sn. The first comparing circuits C0 to Cn and substituting circuits S0 to Sn, as well as the latch circuits L0 to Ln, are provided in correspondence with the redundant word lines RWL0 to RWLn, respectively. The first comparing circuits C0 to Cn compare the externally input row address with the defective addresses held in the latch circuits L0 to Ln, respectively. The substituting circuits S0 to Sn output the substitution commands, for substituting the redundant word lines RWL for the prime word lines PWL, to redundancy match lines RML0 to RMLn based on the comparison results in the first comparing circuits C0 to Cn. The substitution commands output from the substituting circuits S0 to Sn are transmitted to the redundant word line drivers 41-0 to 41$n$ through the redundancy match lines RML0 to RMLn.

The first detecting circuit 30 includes a NOR gate 31. The NOR gate 31 carries out the logical NOR among signals in the redundancy match lines RML0 to RMLn. The operation results in the NOR gate 31 are supplied to the prime word line drivers 40-0 to 40-$m$ through a prime word line non-select line NSL.

Figure 7D:
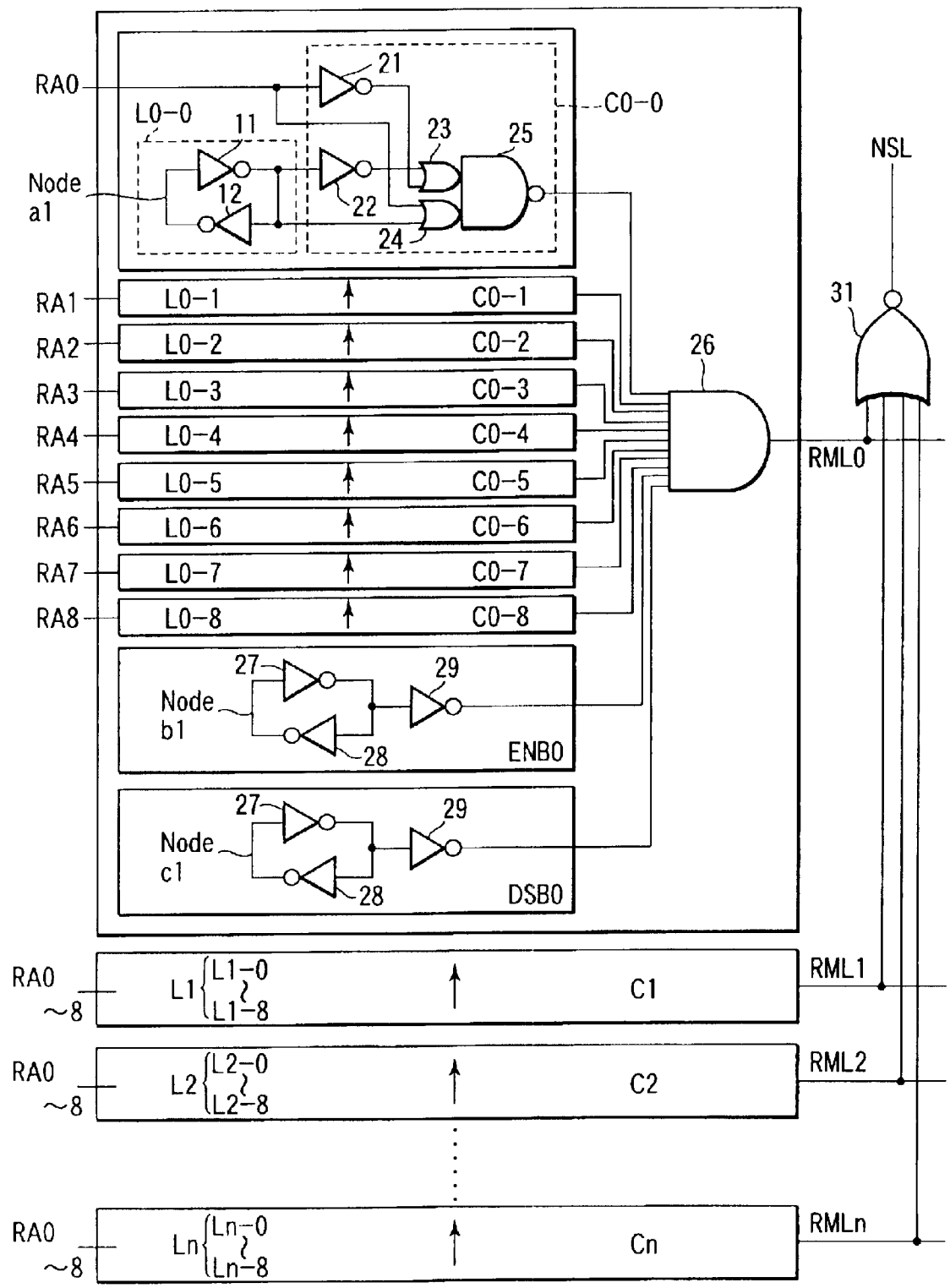
FIG. 7D is a circuit diagram showing a part of the redundancy control circuit of the semiconductor device according to the first embodiment.

FIG. 7D is a circuit diagram showing the structure of the redundancy control circuit RDNT_CNT in more detail. Although FIG. 7D shows details of only the structure corresponding to the redundancy match line RML0 in particular, all of the circuits corresponding to the other redundancy match lines RML1 to RMLn have the same structure. FIG. 7D shows the case of a 9-bit row address.

The latch circuit L0 comprises 9 latches L0-0 to L0-8 which hold the respective bits of a 9-bit defective address. Each of the latches L0-0 to L0-8 includes an inverter 11 and an inverter 12. An input node of the inverter 11 is connected to an output node of the inverter 12, and an output node of the inverter 11 is connected to an input node of the inverter 12. A defective address is written in a node a1, i.e., a connection node between the input node of the inverter 11 and the output node of the inverter 12. The latch circuits L1 to Ln, which have the same structure as that of the latch circuit L0, respectively include latches L1-0 to L1-8, L2-0 to L2-8, . . . and Ln-0 to Ln-8.

The first comparing circuit C0 comprises comparators C0-0 to C0-8, which compare the respective bits of the defective address held in the latches L0-0 to L0-8 with the respective bits RA0 to RA8 of the 9-bit row address. Each of the comparators C0-0 to C0-8 comprises inverters 21 and 22, OR gates 23 and 24, and a NAND gate 25. The OR gates 23 carry out the logical OR between the respective bits RA0 to RA8 of the row address inverted by the inverter 21 and the respective bits of the defective address. The OR gates 24 carry out the logical OR between the respective bits RA0 to RA8 of the row address and the respective bits of the defective address inverted by the inverter 11. Each NAND gate 25 carries out the logical NAND between the outputs of the OR gates 23 and 24. The first comparators C1 to Cn, which have the same structure as that of the first comparator C0, respectively include comparators C1-0 to C1-8, C2-0 to C2-8, . . . and Cn-0 to Cn-8.

The substituting circuit S0 comprises an AND gate 26, an enable circuit ENB0 and a disable circuit DSB0. The enable circuit ENB0 and the disable circuit DSB0 have the same structure. More specifically, each of the enable circuit ENB0 and the disable circuit DSB0 has inverters 27 to 29. An input node of the inverter 27 is connected to an output node of the inverter 28, and an output node of the inverter 27 is connected to an input node of the inverter 28. The inverter 29 inverts a signal at the connection node between the output node of the inverter 27 and the input node of the inverter 28. In the enable circuit ENB0, an enable signal ENB_S is written in a node b1, i.e., a connection node between the input node of the inverter 27 and the output node of the inverter 28. In the disable circuit DSB0, a disable signal DSB_S is written in a node c1, i.e., a connection node between the input node of the inverter 27 and the output node of the inverter 28. The AND gate 26 carries out the logical AND among the outputs of the NAND gates 25 of the respective comparators C0-0 to C0-8 and the outputs of the enable circuit ENB0 and the disable circuit DSB0. The result of the AND operation is output to the redundancy match line RML0. The enable signal ENB_S is information concerning whether to use the redundancy information (defective address) held in the latch circuit L0. In other words, the information represents whether to use the redundant word line RWL0 corresponding to the substituting circuit S0. If the defective address is used, the enable signal ENB_S is set to "H" level. If not, it is set to "L" level. The disable signal DSB_S is normally set to "H" level, as will be described later.

Therefore, when the respective bits of the defective address held in the latches L0-0 to L0-8 completely correspond to the respective bits RA0 to RA8 of the row address and both the enable signal ENB_S and the disable signal DSB_S are at "H" level, the output of the AND gate 26 of the substituting circuit S0 is at "H" level. In other words, in this case, the substituting circuit outputs the substitution command and an "H" level signal is output to the redundancy match line RML0. The substituting circuits S1 to Sn, which have the same structure as that of the substituting circuit S0, respectively include AND gates 26, enable circuits ENB1 to ENBn and disable circuits DSB1 to DSBn.

A method for recovering the semiconductor memory device according to this embodiment will now be described with reference to FIGS. 8A to 8D. FIGS. 8A to 8D are block diagrams showing the row decoder R/D and the redundancy control circuit RDNT_CNT, in particular, which schematically show the redundancy system of the semiconductor device according to this embodiment. To make the explanation simple, it is assumed that the semiconductor device has four redundant word lines RWL. Further, to simplify the diagrams, the combinations of the substituting circuits S0 to S3, the first comparing circuits C0 to C3 and the latch circuits L0 to L3, corresponding to the redundancy match lines RML0 to RML3, are respectively called control sections 50-0 to 50-3.

First, all cells included in the prime memory cell array PRIM_ARRAY (and the redundant memory cell array RDNT_ARRAY) are tested, so that defective memory cell can be detected. It is assumed that defects are found in the prime word lines PWL5 and PWL26 (any prime memory cells connected to the prime word lines PWL5 and PWL26). In this case, the defective addresses 5 and 26 are respectively written in the control sections 50-0 and 50-1 (see FIG. 8A). This process means that the redundant word line RWL0 is substituted for the prime word line PWL5 and the redundant word line RWL1 is substituted for the prime word line PWL26. All disable signals DSB_S are set to the "H" level.

In this state, assume that the row address 6 is accessed. FIG. 8B shows this state. The control sections 50-0 and 50-1 compares the defective addresses 5 and 26 with the row address 6. Since the row address does not match with the defective addresses in all control sections, the substitution command for substituting a redundant word line for a prime word line is not output. In other words, the "L" level signal is output to all redundancy match lines RML0 to RML3. Accordingly, the row decoder R/D2 does not select a redundant memory cell. The output of the NOR gate 31 is also at the "H" level. Accordingly, the row decoder R/D1 is in the enable state. Therefore, the prime word line driver 40-6 in the row decoder R/D1 activates the prime word line PWL6 corresponding to the row address 6.

Further, assume that the row address 5 is accessed in this state. FIG. 8C shows this state. Since the row address matches with the defective address in the control section 50-0, the substitution command is output to the redundancy match line RML0, which is then set to "H" level. In accordance with the substitution command, the redundant word line driver 41-0 in the row decoder R/D2 activates the redundant word line RWL0. Further, since the redundancy match line RML0 is at the "H" level, the prime word line non-select line NSL is set to the "L" level by the NOR gate 31. As a result, the row decoder R/D1 is set in the disable state. Therefore, the prime word line PWL5 is not selected, while only the redundant word line RWL0 is selected.

Figure 8A:
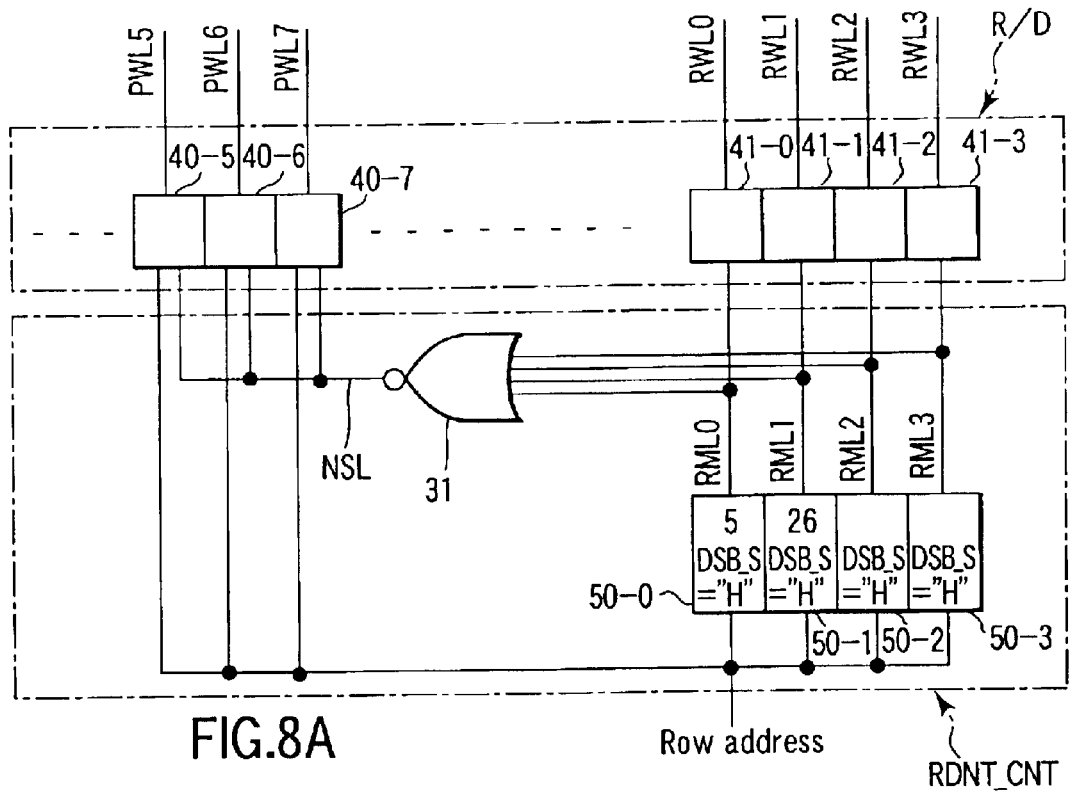
FIG. 8A is a schematic diagram showing a redundancy system of the semiconductor device according to the first embodiment.
Figure 8B:
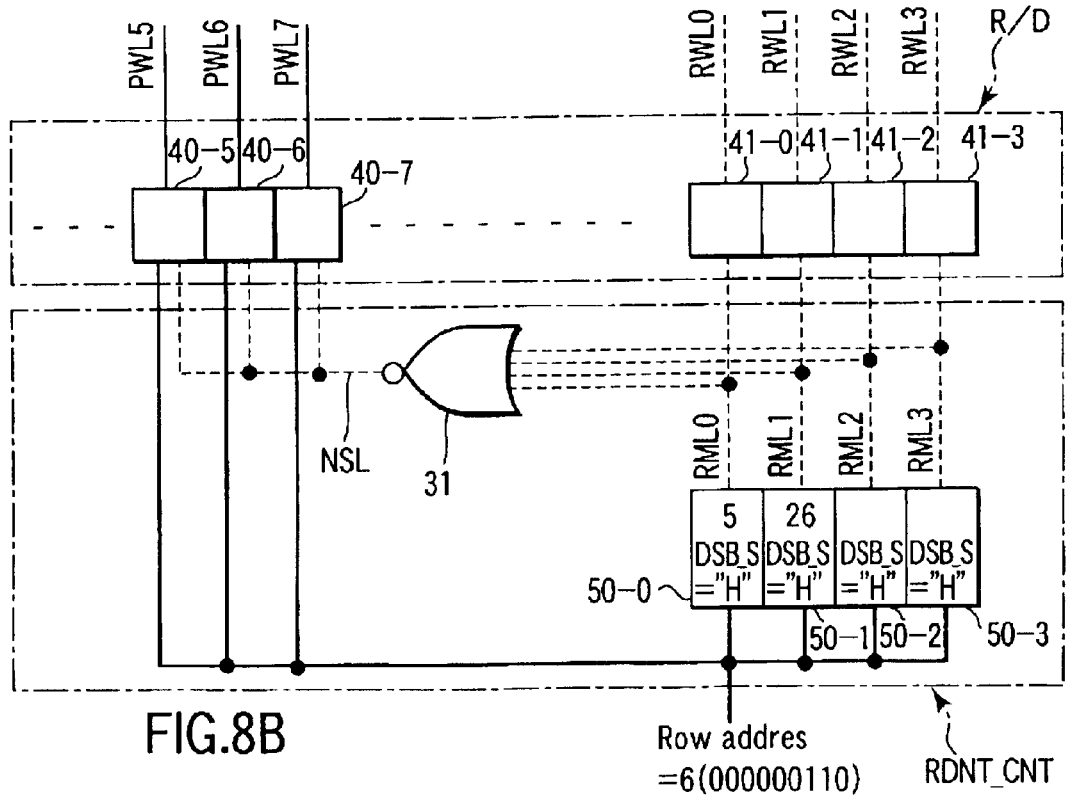
FIG. 8B is a schematic diagram showing the redundancy system of the semiconductor device according to the first embodiment, in which a normal cell is accessed.
Figure 8C:
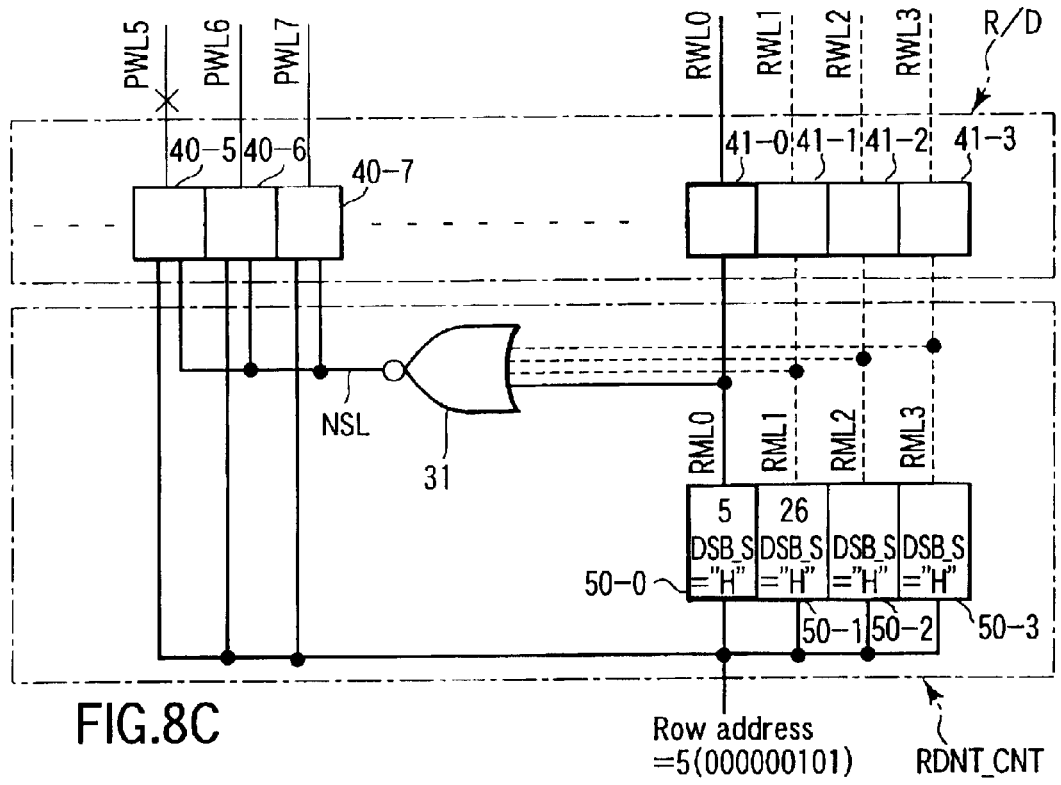
FIG. 8C is a schematic diagram showing the redundancy system of the semiconductor device according to the first embodiment, in which a defective memory cell is accessed.
Figure 8D:
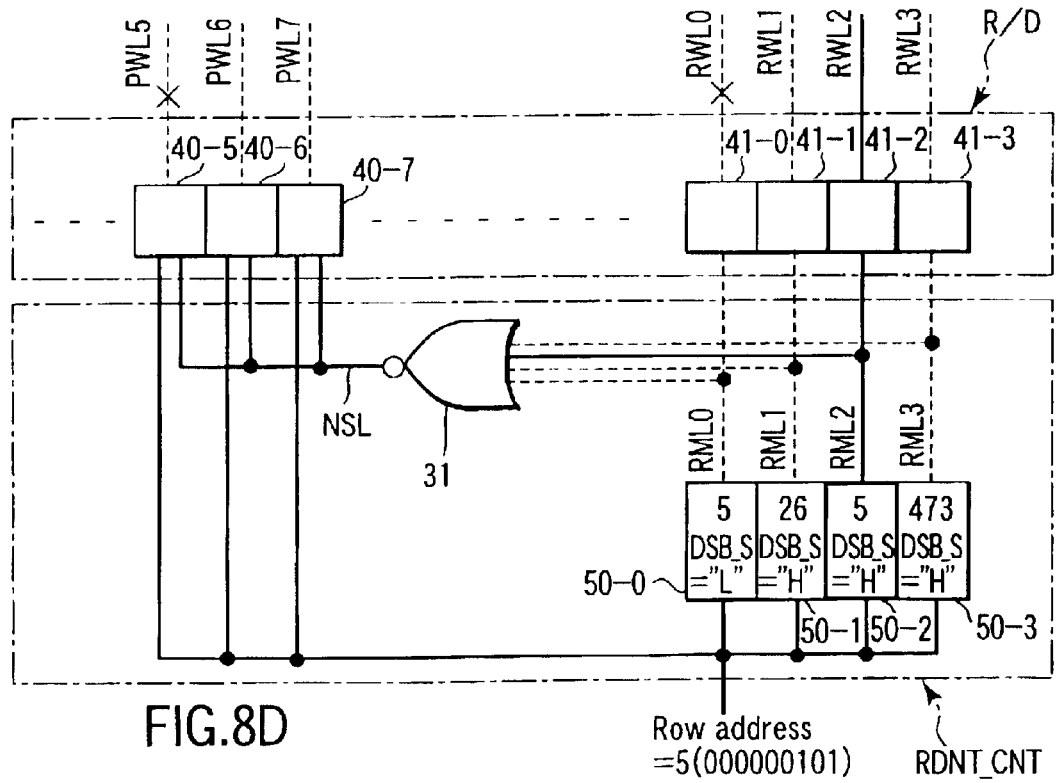
FIG. 8D is a schematic diagram showing the redundancy system of the semiconductor device according to the first embodiment, in which a defective memory cell is accessed.

Then, a test is carried out again in the state shown in FIG. 8A. Assume that defects are found in the row addresses 5 and 473. Since the prime word line PWL5 is replaced by the redundant word line RWL0, the row address 5 now represents the redundant word line RWL0. Therefore, the finding of the defect in the row address 5 means that the defect lies in the redundant word line RWL0. The row addresses 5 and 473 are held in the control sections 50-2 and 50-3. In this state, assume that the row address 5 is accessed. FIG. 8D shows this state.

As described above, the redundant word line RWL0 is substituted for the prime word line PWL5 corresponding to the row address 5. Further, the redundant word line RWL2 is substituted for the redundant word line RWL0. When a redundant word line is substituted for another redundant word line as in this case, to prevent a defective redundant word line from being selected, the disable signal DSB_S in the control section corresponding to the defective redundant word line is set to the "L" level. Specifically, the disable signal DSB_S in the control section 50-0 is set to the "L" level. Then, as described above with reference to FIG. 7D, the output of the AND gate 26 is kept at the "L" level regardless of the result of the comparison between the row address and the defective address and the state of the enable signal ENB_S. Therefore, in the example shown in FIG. 8D, the control section 50-0 does not output the substitution command and the redundancy match line RML0 is at the "L" level. Consequently, the redundant word line RWL0 cannot be selected. On the other hand, in the control section 50-2, since the disable signal DSB_S is at the "H" level, the control section 50-2 outputs the substitution command and the redundancy match line RML2 is at "H" level. Accordingly, the redundant word line driver 41-2 in the row decoder R/D2 activates the redundant word line RWL2. Since the redundancy match line RML2 is at the "H" level, the prime word line non-select line NSL is at the "L" level. Therefore, the row decoder R/D1 is in the disable state, and the prime word line driver 40-5 does not activate the prime word line PWL5. As a result, only the redundant word line RWL2 is selected.

As described above, in the semiconductor memory device according to this embodiment, a disable circuit DSB is provided for every redundancy match line RML, and holds a disable signal DSB_S. The disable signal DSB_S is set to "L" level, so that the corresponding redundancy match line RML is forcibly set to "L" level, thereby causing the redundant word line RWL to be in the non-select state. With this characteristic, even if a defective redundant word line is replaced by another redundant word line, it can be prevented from being selected. Thus, double selection of two word lines can be prevented.

Further, it is noted that the disable circuit DSB is a latch circuit having a plurality of inverters. Therefore, the area occupied by the redundancy control circuit in the semiconductor memory device can be reduced as compared to the case of the conventional device using fuses.

Figure 9A:
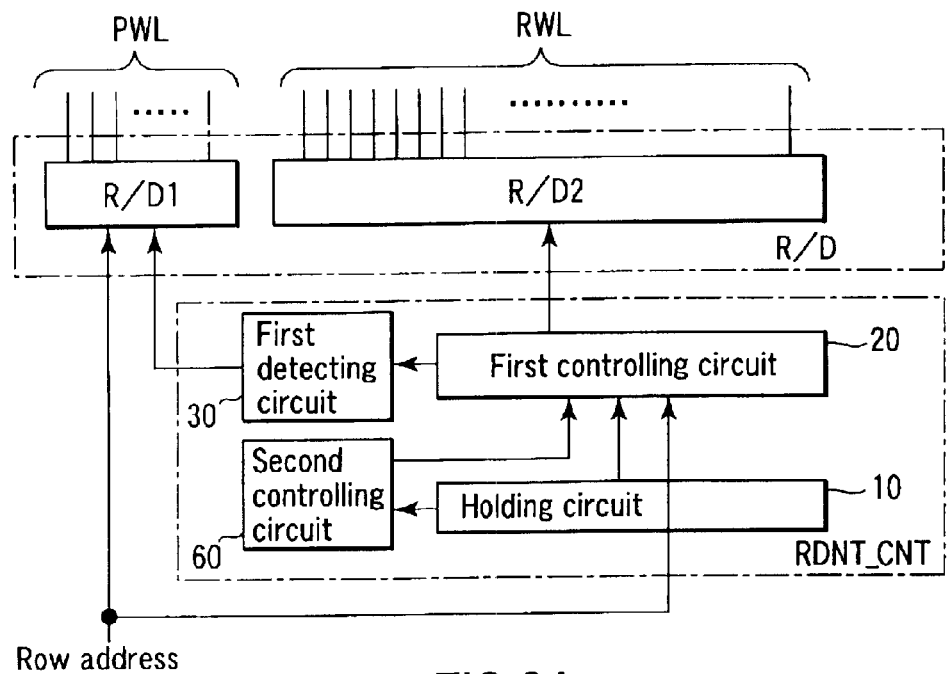
FIG. 9A is a block diagram showing a row decoder and a redundancy control circuit of the semiconductor device according to a second embodiment of the present invention.

A semiconductor device according to a second embodiment of the present invention will now be described with reference to FIG. 9A. FIG. 9A is a block diagram showing the row decoder R/D and the redundancy control circuit RDNT_CNT of the semiconductor memory device shown in FIG. 7A. It illustrates details of the redundancy control circuit RDNT_CNT in particular.

As shown in FIG. 9A, the redundancy control circuit RDNT_CNT of this embodiment comprises a second controlling circuit 60 in addition to the elements of the redundancy control circuit of the first embodiment.

The second controlling circuit 60 determines whether a plurality of latches of the holding circuit 10 hold the same address. If a plurality of latches hold the same defective address, the second controlling circuit 60 requests the first controlling circuit 20 to set a redundant word line corresponding to any one of the portions holding the defective address to the non-select state.

Figure 9B:
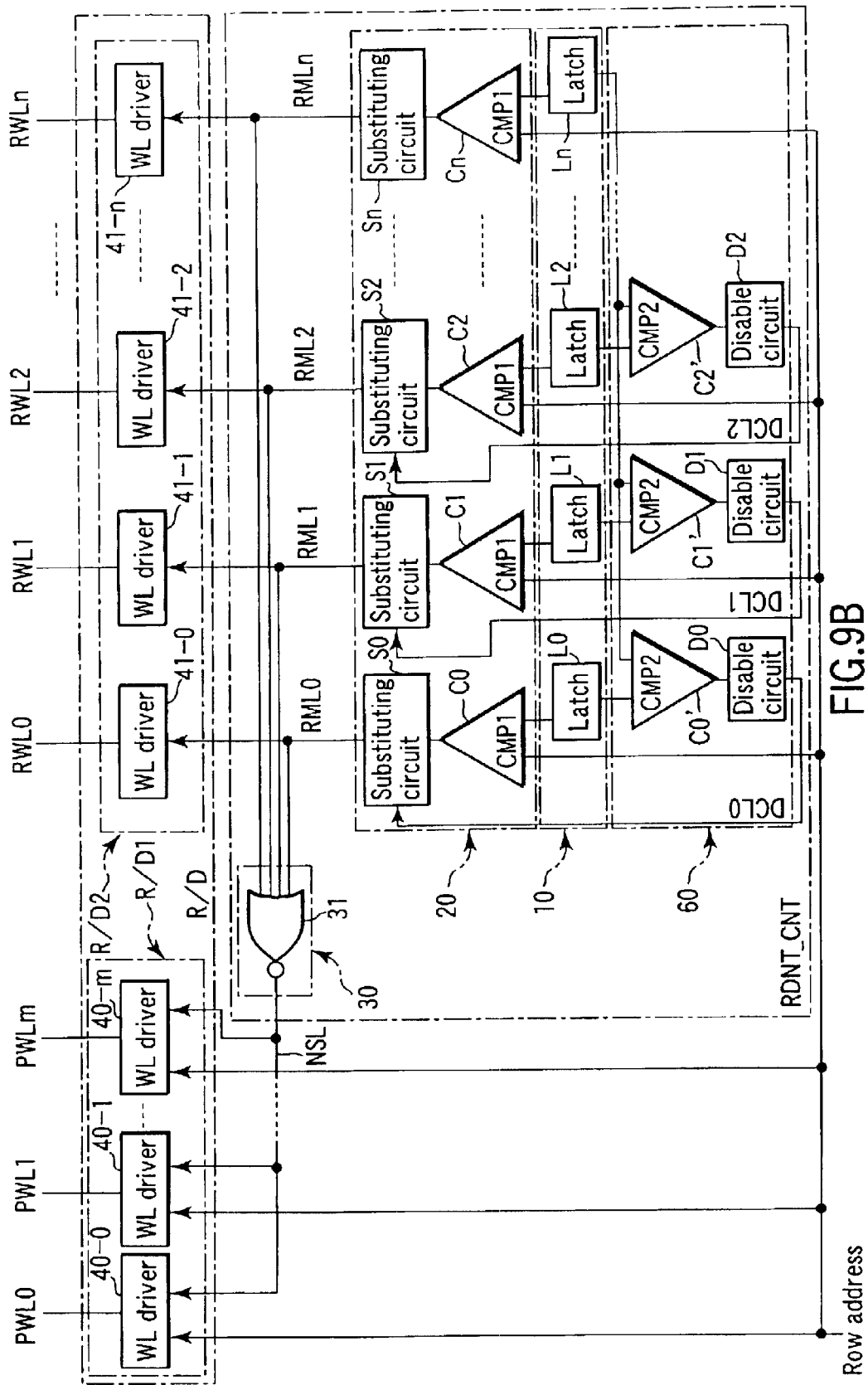
FIG. 9B is a circuit diagram showing the row decoder and the redundancy control circuit of the semiconductor device according to the second embodiment of the present invention.

FIG. 9B is a circuit diagram showing the row decoder R/D and the redundancy control circuit RDNT_CNT, which illustrates the structures of the row decoder R/D and the redundancy control circuit RDNT_CNT in more detail. In the semiconductor memory device according to this embodiment, priorities are assigned to the redundant word lines RWL0 to RWLn. The redundant word lines RWL0 to RWL(n−1) have the same priority and the redundant word line RWLn has a higher priority than that of the redundant word lines RWL0 to RWL(n−1).

The structure of the redundancy control circuit RDNT_CNT will now be described. The structures of the holding circuit 10 and the first detecting circuit 30 are the same as those of the first embodiment.

The second controlling circuit 60 comprises n second comparing circuits C0' to C(n−1)' and n disable circuits D0 to D(n−1). The second comparing circuits C0' to C(n−1)' and the disable circuits D0 to D(n−1), as well as the latch circuits L0 to L(n−1), are provided in correspondence with the redundant word lines RWL0 to RWL(n−1), respectively. There is no second comparing circuit and no disable circuit that corresponds to the n-th redundant word line RWLn.

The second comparing circuits C0' to C(n−1)' respectively compares the defective addresses held in the latch circuits L0 to L(n−1) with the defective address held in the latch circuit Ln.

The disable circuits D0 to D(n−1) supply commands to the respective substituting circuits S0 to S(n−1), as to whether substitution should be performed, based on the results of comparison in the respective second comparing circuits C0' to C(n−1)'. The commands are supplied from the disable circuits D0 to D(n−1) to the respective substituting circuits S0 to S(n−1) through disable control lines DCL0 to DCL(n−1).

As in the first embodiment, the first controlling circuit 20 comprises (n+1) first comparing circuits C0 to Cn and (n+1) substituting circuits S0 to Sn. The substituting circuits S0 to Sn output a command, for substituting redundant word lines RWL for prime word lines PWL, to the redundancy match lines RML0 to RMLn based on the results of comparison in the first comparing circuits C0 to Cn. However, the substituting circuits S0 to S(n−1) are constructed so as not to output the substitution command, when they receive a command not to carry out substitution from the disable circuit D0 to D(n−1).

Figure 9C:
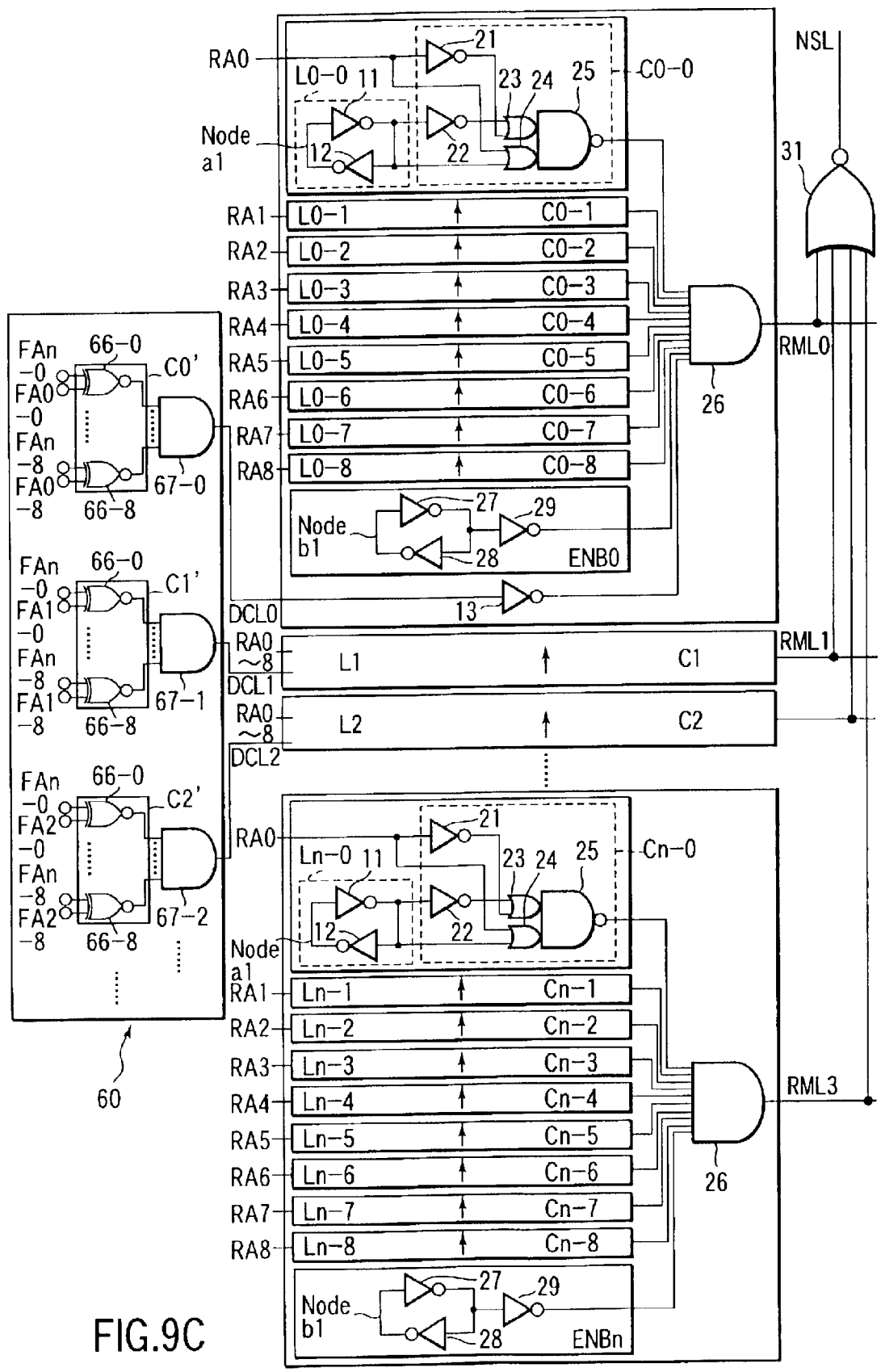
FIG. 9C is a circuit diagram showing a part of the redundancy control circuit of the semiconductor device according to the second embodiment.

FIG. 9C is a circuit diagram showing the structure of the redundancy control circuit RDNT_CNT in more detail. FIG. 9C shows details of only the structure corresponding to the redundancy match lines RML0 and RMLn in particular. The circuits corresponding to the other redundancy match lines RML1 to RML(n−1) have the same structure as that of the redundancy match line RML0. FIG. 9C shows the case of a 9-bit row address.

The latch circuits L0 to L8 and the first comparing circuits C0 to Cn have the same structures as those of the first embodiment, and detailed descriptions thereof are be omitted.

The structure of the substituting circuit S0 is the same as that of the first embodiment except that the disable circuit DSB0 is eliminated and an inverter 13 is added. An input node of the inverter 13 is connected to the disable control line DCL0. The AND gate 26 carries out the logical AND among the outputs of the comparators C0-0 to C0-8, the output of the enable circuit ENB0 and the output of the inverter 13. The result of the AND operation is output to the redundancy match line RML0. The substituting circuits S1 to S(n−1) have the same structure as that of the substituting circuit S0. The substituting circuits S1 to S(n−1) respectively include AND gates 26 and enable circuits ENB1 to ENB(n−1).

The structure of the substituting circuit Sn is the same as those of the substituting circuits S0 to S(n−1) except that the inverter 13 is eliminated. Therefore, the AND gate 26 in the substituting circuit Sn carries out the logical AND among the outputs of the comparators C0-0 to C0-8 and the output of the enable circuit ENBn. The result of the AND operation is output to the redundancy match line RMLn.

The structure of the second controlling circuit 60 will now be described. Each of the second comparing circuits C0' to C(n−1)' in the second controlling circuit 60 has nine XNOR gates 66-0 to 66-8. The disable circuits D0 to D(n−1) respectively comprise AND gates 67-0 to 67-(n−1).

The XNOR gates 66-0 to 66-8 carry out the logical XNOR between the respective bits (9 bits) of the defective address held in the corresponding latches L0-0 to L0-8 and the respective bits (9 bits) of the defective address held in the latch Ln. More specifically, the XNOR gates 66-0 to 66-8 included in the second comparing circuit C0' carry out the logical XNOR between the respective bits FA0-0 to FA0-8 of the defective address held in the latches L0-0 to L0-8 and the respective bits FAn-0 to FAn-8 of the defective address held in the latches Ln-0 to Ln-8. Further, the XNOR gates 66-0 to 66-8 included in the second comparing circuit C1' carry out the logical XNOR between the respective bits FA1-0 to FA1-8 of the defective address held in the latches L1-0 to L1-8 and the respective bits FAn-1 to FAn-8 of the defective address held in the latches Ln-0 to Ln-08. The same operations are carried out in the second comparator circuits C2' to C(n−1)'.

Each of the AND gates 67-0 to 67(n−1) carries out the logical AND among the outputs from the XNOR gates 66-0 to 66-8 included in the corresponding second comparing circuit C0' to C(n−1)'. The outputs of the AND gates 67-0 to 67 (n−1) are respectively connected to the disable control lines DCLn to DCL(n−1).

Therefore, when any one of the defective addresses held in the latch circuits L0 to L(n−1) matches with the defective address held in the latch circuit Ln, the "H" level signal is output to the corresponding disable control line DCL0 to DCL(n−1). The signal output to the disable control lines DCL1 to DCL(n−1) is inverted by the inverters 13 and input to the respective substituting circuits S0 to S(n−1). Thus, the "H" level signal is output to the disable control lines DCL0 to DCL(n−1), so that the redundancy match line RML0 to RML(n−1) are forcibly set to the "L" level.

Figure 10:
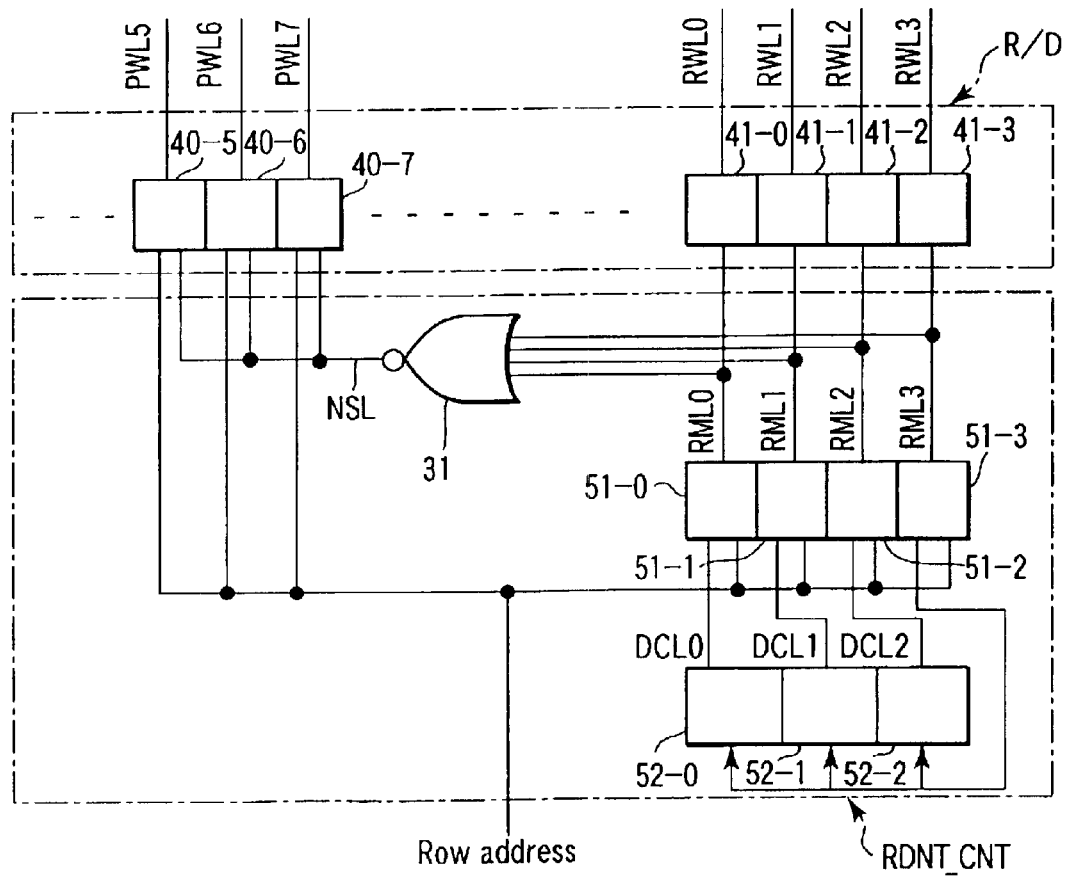
FIG. 10 is a schematic diagram showing a redundancy system of the semiconductor device according to the second embodiment.
Figure 11A:
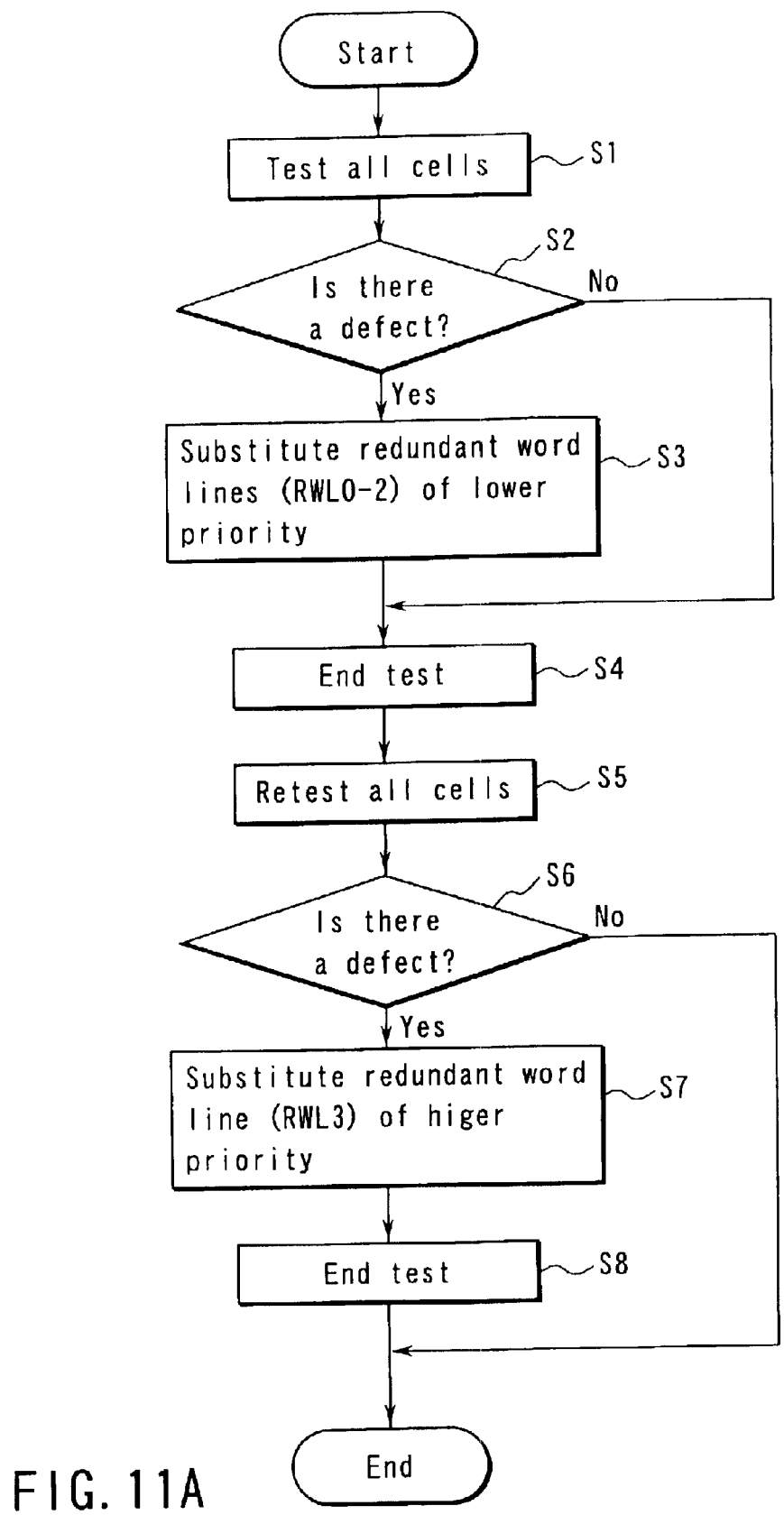
FIGS. 11A and 11B are flowcharts, each showing a process of testing whether there is a defective memory cell in the redundancy system of the semiconductor device according to the second embodiment.
Figure 14A:
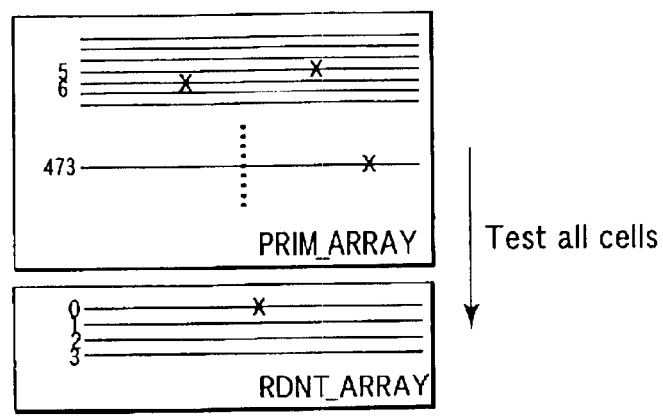
FIG. 14A is a schematic diagram of the redundancy system of the semiconductor device according to the second embodiment, in which a defect is found in a redundant memory cell array.
Figure 14B:
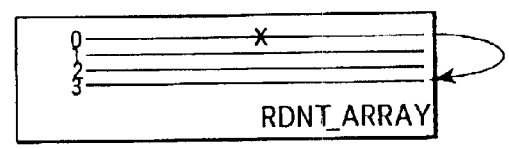
FIG. 14B is a schematic diagram of the redundancy system of the semiconductor device according to the second embodiment, in which the defect found in the redundant memory cell array is replaced by a redundant memory cell.
Figure 15:
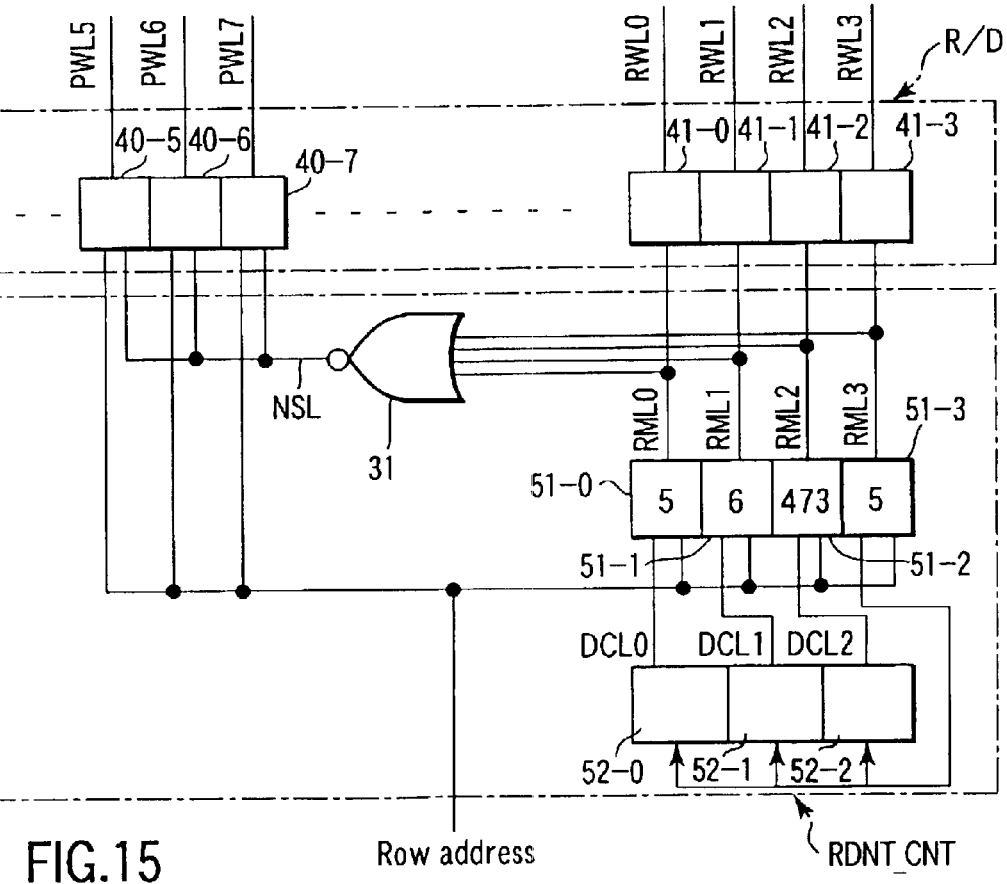
FIG. 15 is a schematic diagram showing the redundancy system of the semiconductor device according to the second embodiment, in which the address of a defective memory cell is stored.
Figure 16:
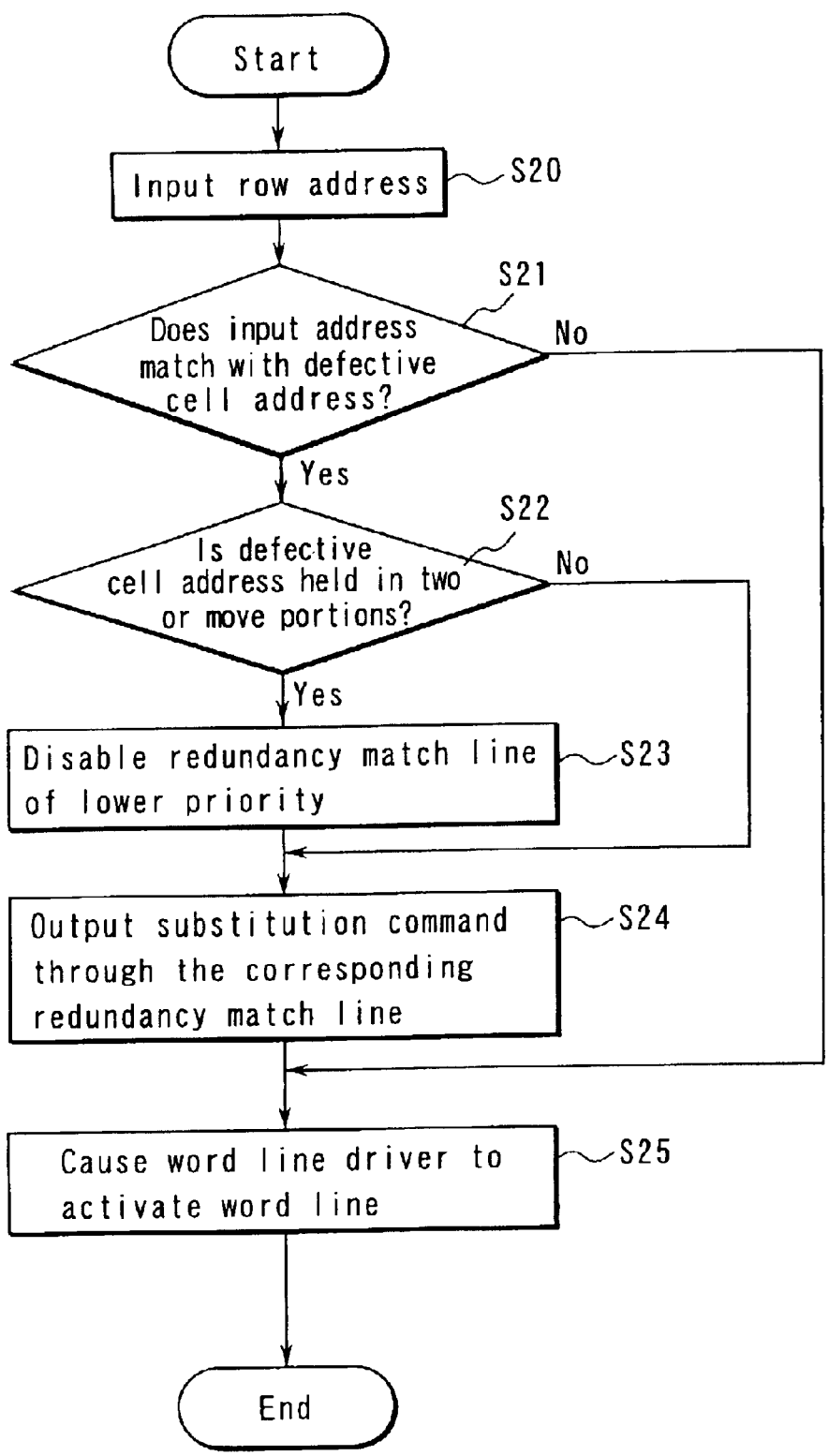
FIG. 16 is a flowchart showing a process executed when a defective memory cell is accessed in the redundancy system of the semiconductor device according to the second embodiment.

A method for recovering the semiconductor memory device according to this embodiment will be described with reference to FIGS. 10, 11A, 12A, 12B, 13, 14A, 14B, 15, 16, 17A and 17B. FIGS. 10, 13, 15, 17A and 17B are block diagrams showing the row decoder R/D and the redundancy control circuit RDNT_CNT, in particular, which schematically show the redundancy system of the semiconductor device according to this embodiment. To make the explanation simple, it is assumed that the semiconductor device has four redundant word lines RWL. It is also assumed that the redundant word lines RWL0 to RWL2 have the same priority and the redundant word line RWL3 has a higher priority than that of the redundant word lines RWL0 to RWL2. To simplify the diagrams, as shown in FIG. 10, the combinations of the substituting circuits S0 to S3, the first comparing circuits C0 to C3 and the latch circuits L0 to L3, corresponding to the redundancy match lines RML0 to RML3, are respectively called first control sections 51-0 to 51-3. Further, combinations of the second comparing circuits C0' to C2' and the disable circuits D0 to D2, corresponding to the redundancy match lines RML0 to RML2, are respectively called second control sections 52-0 to 52-2. FIG. 11A is a flowchart showing a process for testing the semiconductor device according to this embodiment. FIG. 16 is a flowchart showing a process for selecting a word line. FIGS. 12A, 12B, 14A and 14B are schematic diagrams showing states of the prime memory cell array PRIM_ARRAY and the redundant memory cell array RDNT_ARRAY, when the semiconductor memory device of this embodiment is tested.

Figure 12A:
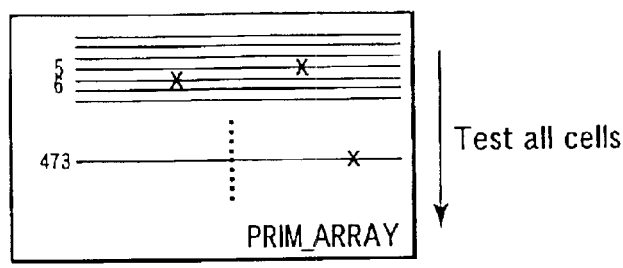
FIG. 12A is a schematic diagram of the redundancy system of the semiconductor device according to the second embodiment, in which a defect is found in a prime memory cell array.

First, a first test for testing all cells included in the prime memory cell array PRIM_ARRAY (and the redundant memory cell array RDNT_ARRAY) are performed, so that a defective memory cell can be detected (FIG. 11A, a step S1). If no defect is detected, the first test is ended (a step S4). It is assumed that defects are found in the prime word lines PWL5 and PWL6 and PWL473 (a step S2). FIG. 12A schematically shows this state. The description "a defect is found in a word line" means that a defect is found in either the word line itself or the memory cell connected to the word line.

Figure 12B:
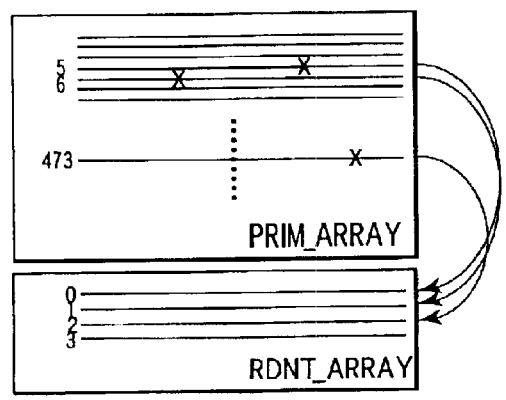
FIG. 12B is a schematic diagram of the redundancy system of the semiconductor device according to the second embodiment, in which the defect found in the prime memory cell array is replaced by a redundant memory cell.
Figure 13:
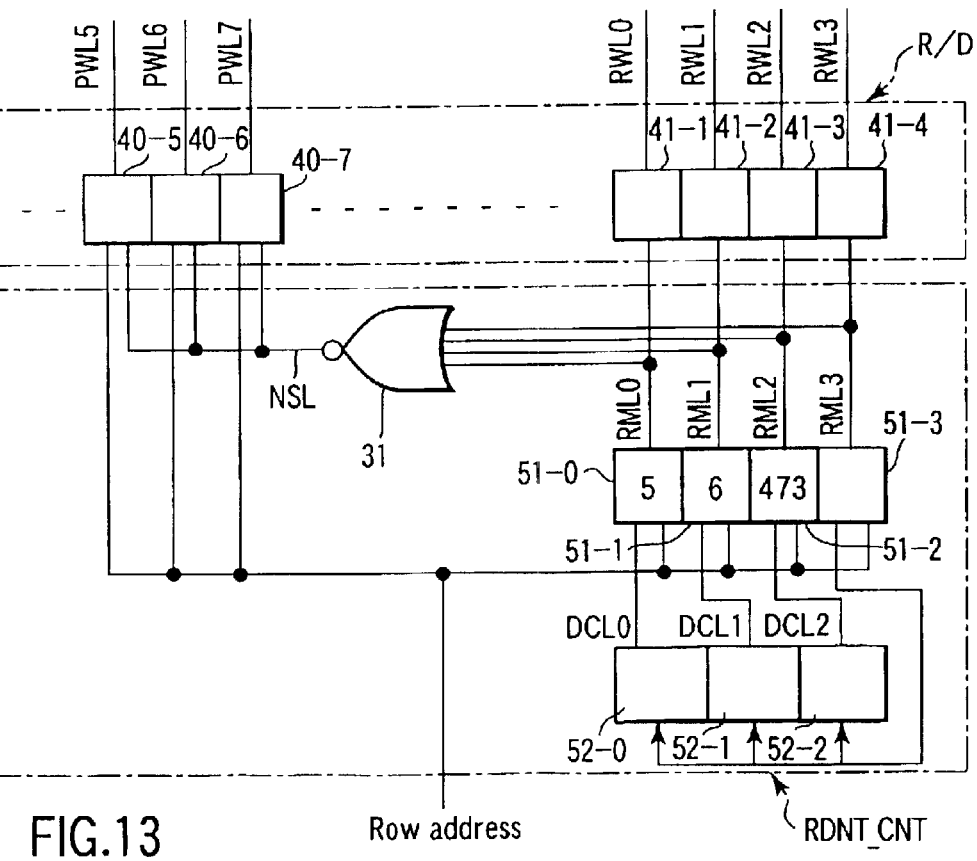
FIG. 13 is a schematic diagram showing the redundancy system of the semiconductor device according to the second embodiment, in which the address of a defective memory cell is stored.

The defective addresses detected in the first test are written in the first control sections having the lower priority. Specifically, the defective addresses 5, 6 and 473 are written in the first control sections 51-0 to 51-2, as shown in FIG. 13 (a step S3). This process means that the redundant word line RWL0 is substituted for the prime word line PWL5, the redundant word line RWL1 is substituted for the prime word line PWL6, and the redundant word line RWL2 is substituted for the prime word line 473, as shown in FIG. 12B.

When the substitution of the redundant word lines for the prime word lines, in which defects are detected, is completed, as described above, the first test is ended (a step S4).

Then, a second test is performed. All cells in the prime memory cell array PRIM_ARRAY and the redundant memory cell array RDNT_ARRAY are tested, so that a defect can be detected (a step S5). If no defect is detected, the second test is ended (a step S8). At this time, the word lines corresponding to the row addresses 5, 6 and 473 are not the prime word lines PWL5, PWL6 and PWL473, but the redundant word lines RWL0, RWL1 and RWL2. In this state, it is assumed that a defect is found in the redundant word line RWL0 (a step 56). FIG. 14A schematically shows this state.

The defective address detected in the second test is written in the first control section having the higher priority. Specifically, the defective address 5 is written in the first control section 51-3, as shown in FIG. 15 (a step S7). This process means that the redundant word line RWL3 is substituted for the redundant word line RWL0 that has been substituted for the prime word line PWL5, as shown in FIG. 14B.

When the substitution of the redundant word line for the redundant word line, in which a defect is detected, is completed, as described above, the second test is ended (a step S8).

Figure 17A:
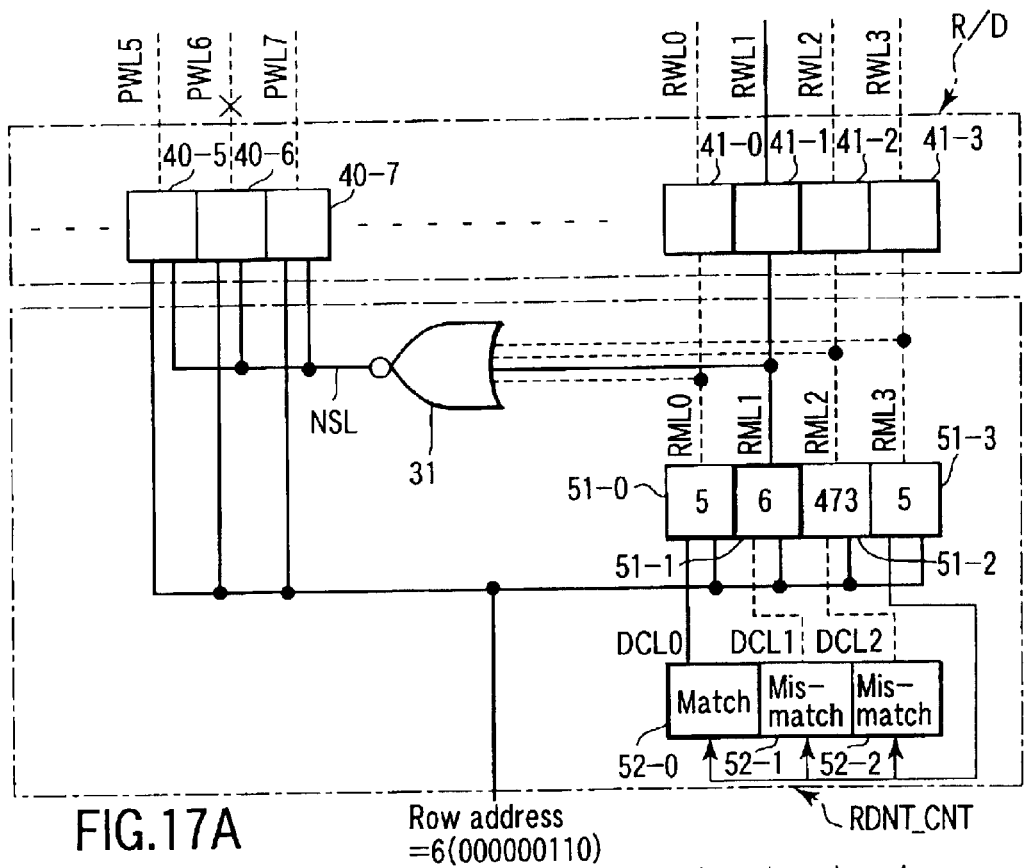
FIG. 17A is a schematic diagram showing the redundancy system of the semiconductor device according to the second embodiment, in which a defective memory cell is accessed.
Figure 17B:
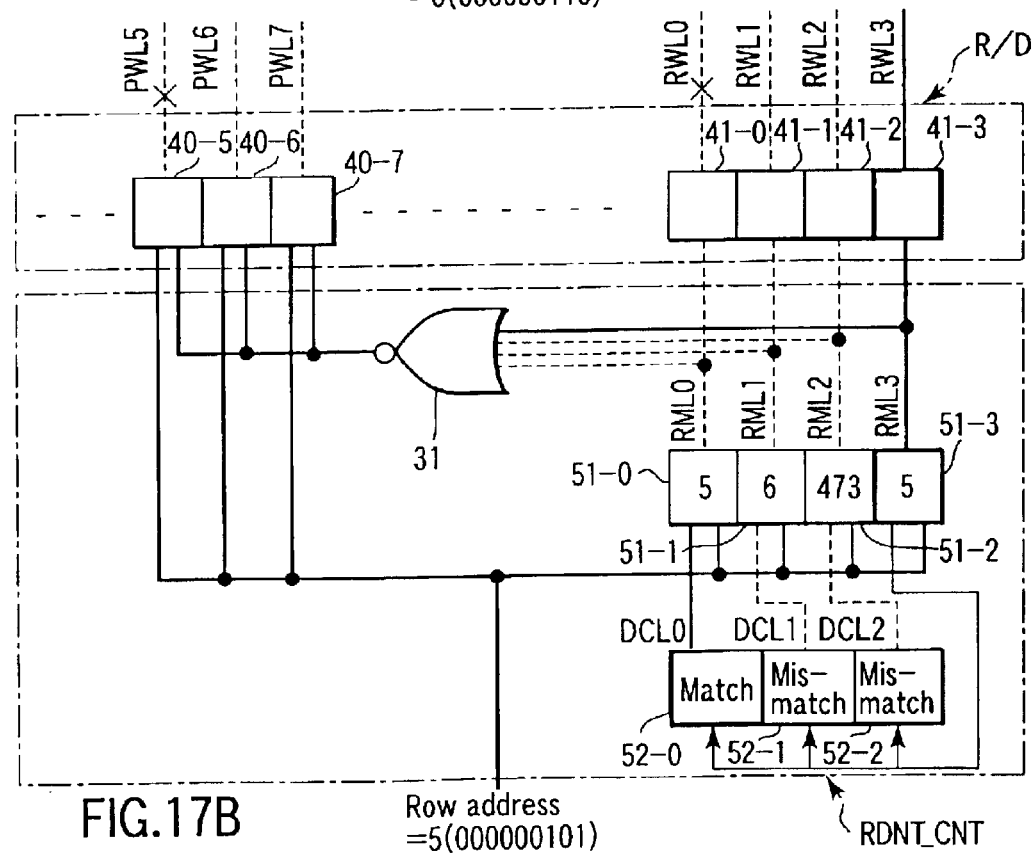
FIG. 17B is a schematic diagram showing the redundancy system of the semiconductor device according to the second embodiment, in which a defective memory cell is accessed.

A method for accessing the semiconductor memory device, in which defects are detected in the prime word lines PWL5, PWL6 and PWL473 and the redundant word line RWL0, will be described with reference to FIG. 16 and FIGS. 17A and 17B. FIG. 16 is a flowchart showing a method for accessing the semiconductor memory device according to this embodiment. FIGS. 17A and 17B are block diagrams showing the row decoder R/D and the redundancy control circuit RDNT_CNT of the same structures as those shown in FIG. 10.

First, a row address is input through the row control circuit ROW_CNT to the redundancy control circuit RDNT_CNT (FIG. 16, a step S20). If the input row address does not match with a defective address (a step S21), any of the prime word lines PWL0 to PWLM corresponding to the row address is activated by the corresponding prime word line drivers 40-1 to 40-m (a step S25).

If the input row address matches with a defective address (a step S21), it is then determined whether the defective address is held in a plurality of portions of the first control sections 51-0 to 51-3 (a step S22). This process will be described in detail with reference to FIG. 17A. FIG. 17A shows a case in which the row address 6 is input and the first controlling circuits 51-0 to 51-3 respectively store the defective addresses 5, 6, 473 and 5, as described above with reference to FIG. 15.

The second control sections 52-0 to 52-2 respectively compares the defective addresses 5, 6 and 473 held in the first control sections 51-0 to 51-2 corresponding to the redundancy match lines RML0 to RML2 of the lower priority with the defective address 5 held in the first control section 51-3 corresponding to the redundancy match line RML3 of the higher priority.

In this case, the result of comparison is "match" in the second control section 52-0. Accordingly, the second control section 52-0 set the disable control line DCL0 to the "L" level. In other words, the first control section 51-0 is forcibly disabled (a step S23).

In this state, the first control section 51-1, holding the defective address which matches with the row address 6, outputs the substitution command through the redundancy match line RML1. In other words, the redundancy match line RML1 is set to the "H" level (a step S24). As a result, the redundant word line driver 41-1 activates the redundant word line RWL1 (a step S25). Since the redundancy match line RML1 is at the "H" level, the NOR gate 31 sets the prime word line non-select line NSL to the "L" level. Therefore, the prime word line drivers 40-0 to 40-m are set in the disable state. Accordingly, the prime word line PWL6 is not selected.

The steps subsequent to the step 22 with respect to another case will be described with reference to FIG. 17B. FIG. 17B shows a case in which the row address 5 is input.

In this case also, the second control section 51-0 sets the disable control line DCL0 to the "L" level. Accordingly, the first control section 51-0 is forcibly disabled (a step S23).

In this state, the first control section 51-3, holding the defective address which matches with the row address 5, outputs the substitution command through the redundancy match line RML3. In other words, the redundancy match line RML3 is set to the "H" level (a step S24). As a result, the redundant word line driver 41-3 activates the redundant word line RWL3 (a step S25). Since the redundancy match line RML3 is at the "H" level, the NOR gate 31 sets the prime word line non-select line NSL to the "L" level. Therefore, the prime word line drivers 40-0 to 40-m are set in the disable state. Accordingly, the prime word line PWL5 is not selected.

Thus, when the row address 5 is accessed, there are three word lines corresponding to the row address 5: the defective prime word line PWL5, the defective redundant word line RWL0 and the normal redundant word line RWL3. However, the access to the prime word line PWL5 is inhibited by setting the prime word line non-select line NSL to the "L" level, and the access to the redundant word line RWL0 is inhibited by setting the redundancy match line RML0 to the "L" level. As a result, only the normal redundant word line RWL3 is accessed.

Figure 1A:
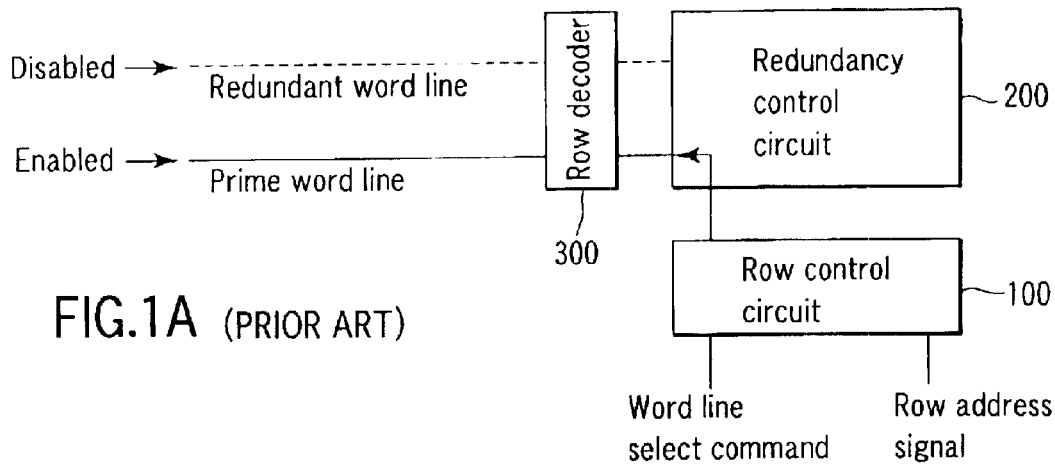
FIG. 1A is a schematic diagram showing a redundancy system in a conventional semiconductor device, in which a normal prime word line is accessed.
Figure 1B:
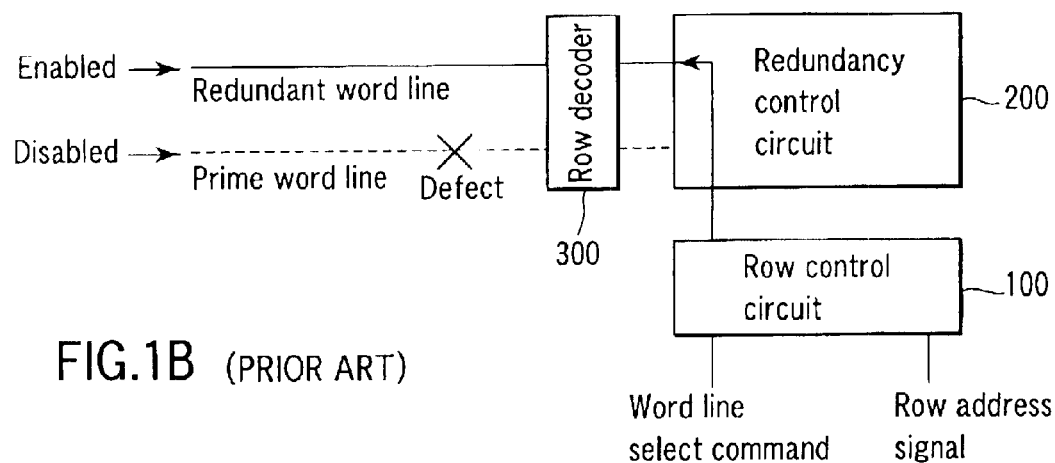
FIG. 1B is a schematic diagram showing the redundancy system in the conventional semiconductor device, in which a defective prime word line is accessed.
Figure 2:
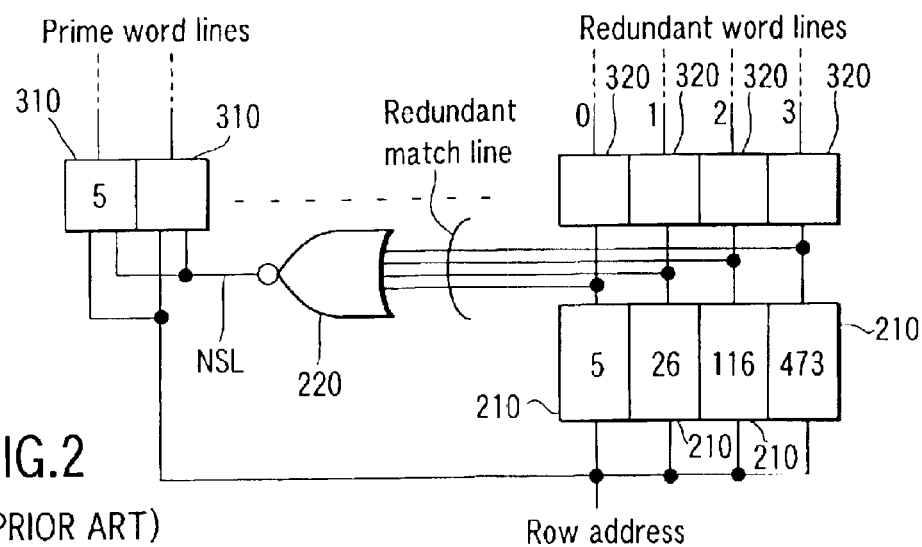
FIG. 2 is a schematic diagram showing the redundancy system of the conventional semiconductor device.
Figure 3:
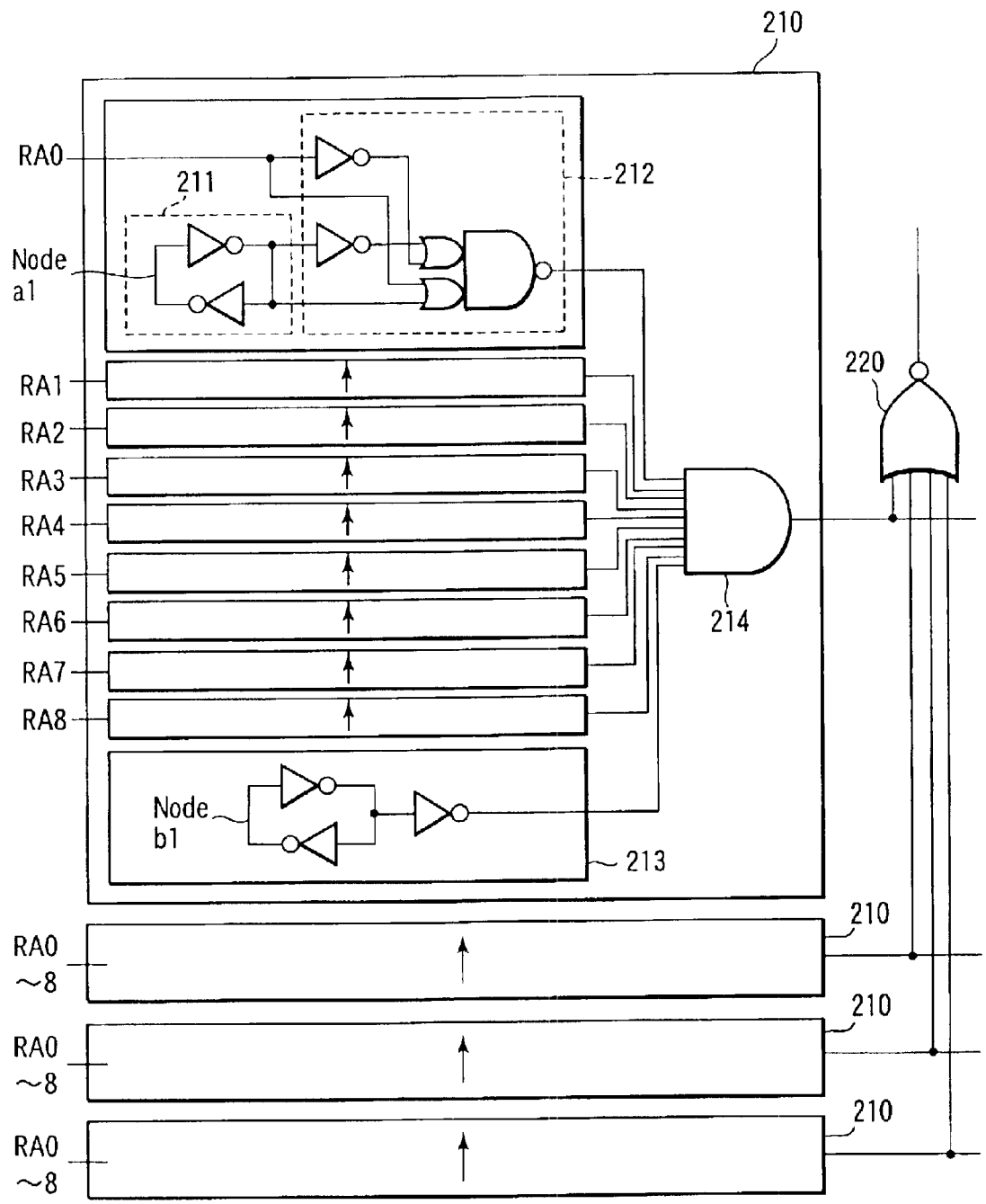
FIG. 3 is a block diagram showing a part of a redundancy control circuit of the conventional semiconductor device.
Figure 4:
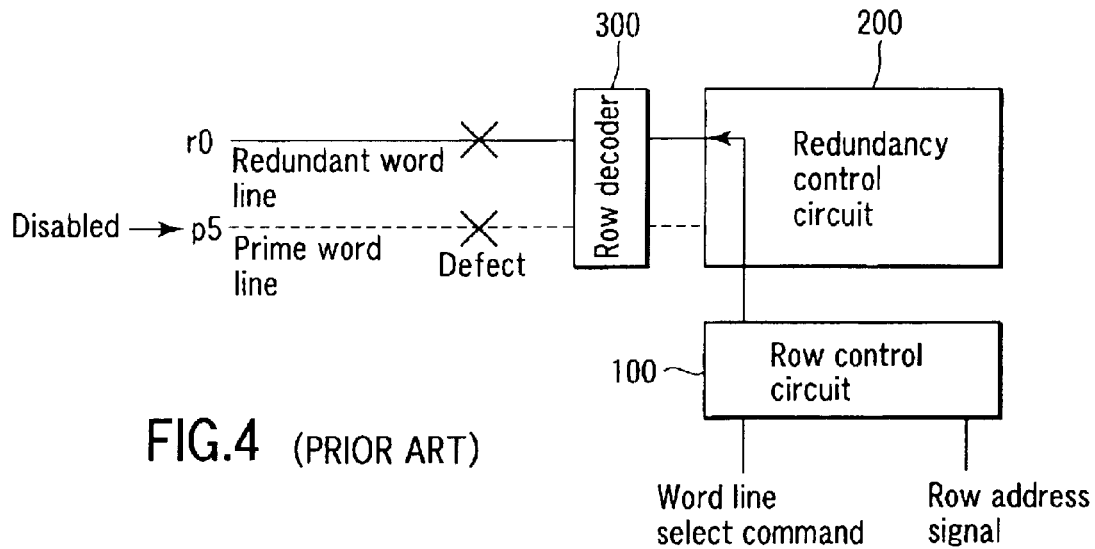
FIG. 4 is a schematic diagram showing the redundancy system of the conventional semiconductor device, in which a defect occurs in a redundant word line.
Figure 5B:
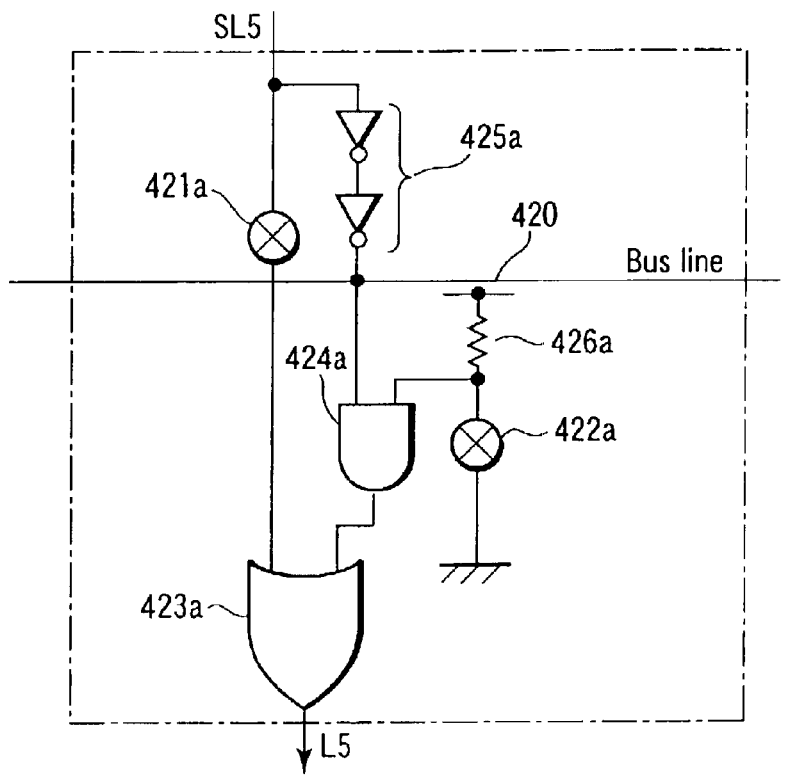
FIG. 5B is a circuit diagram showing the redundancy system of the conventional semiconductor device.
Figure 5A:
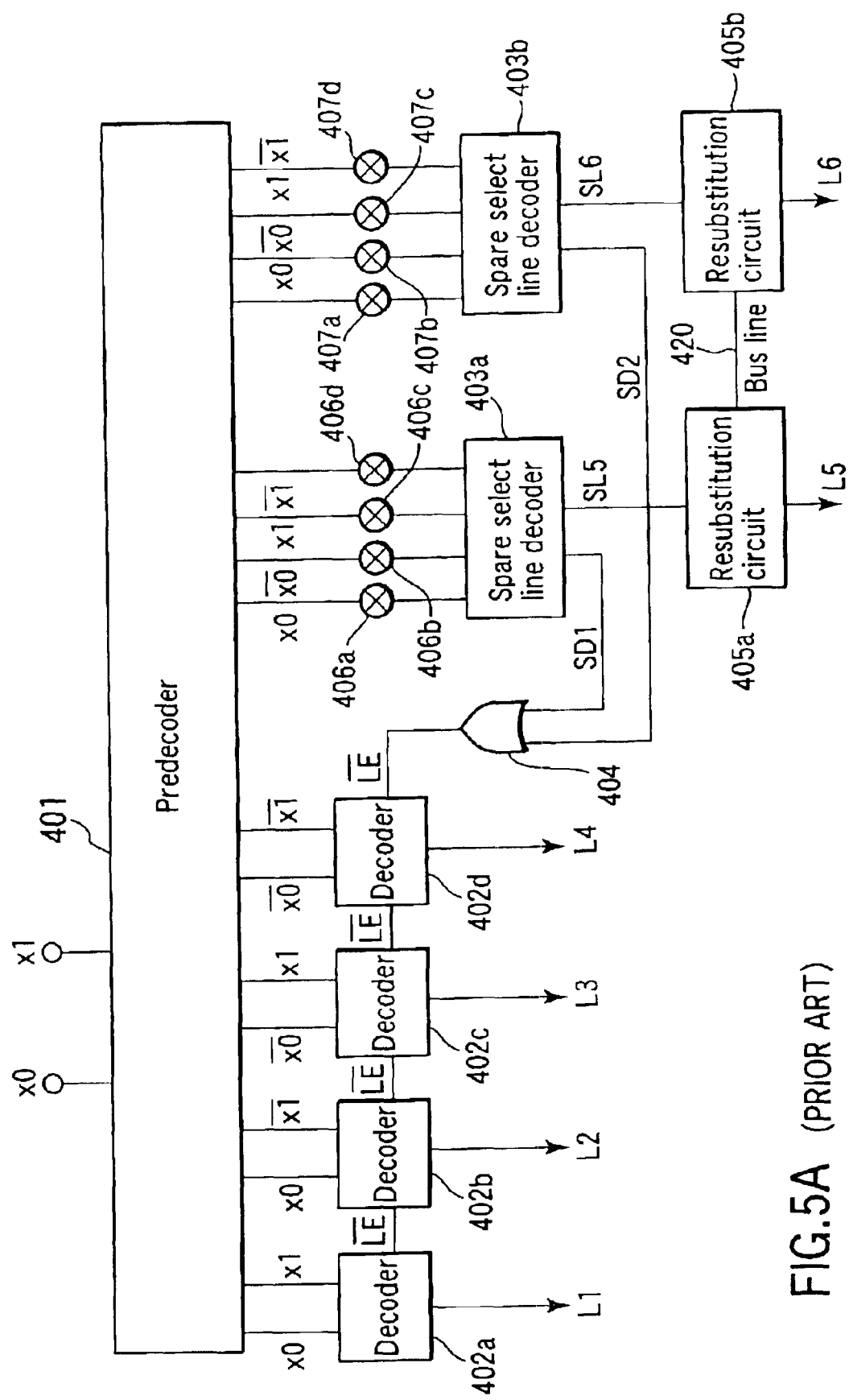
FIG. 5A is a block diagram showing a redundancy system of a conventional semiconductor device.
Figure 6A:
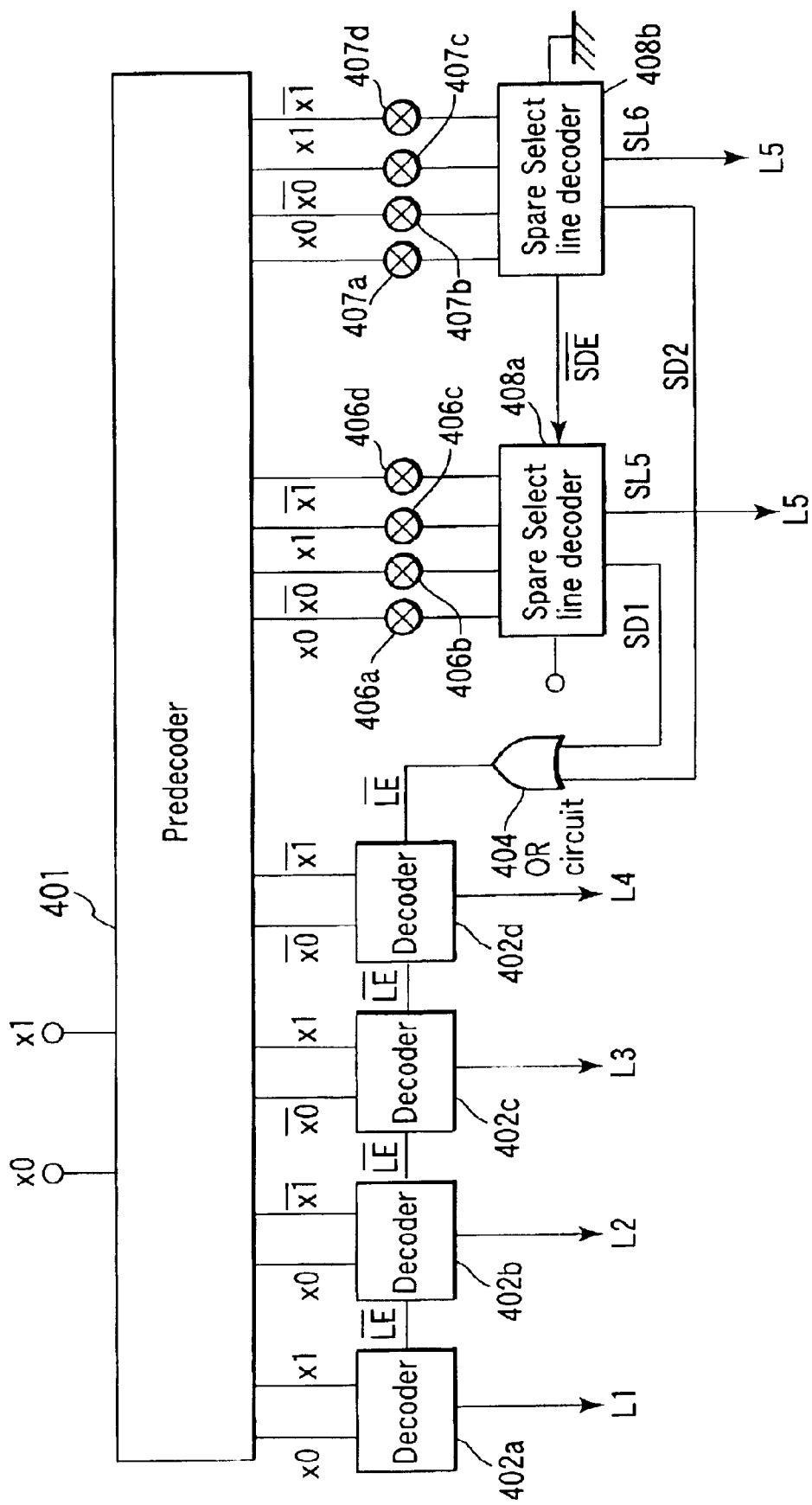
FIG. 6A is a block diagram showing a redundancy system of a conventional semiconductor device.
Figure 6B:
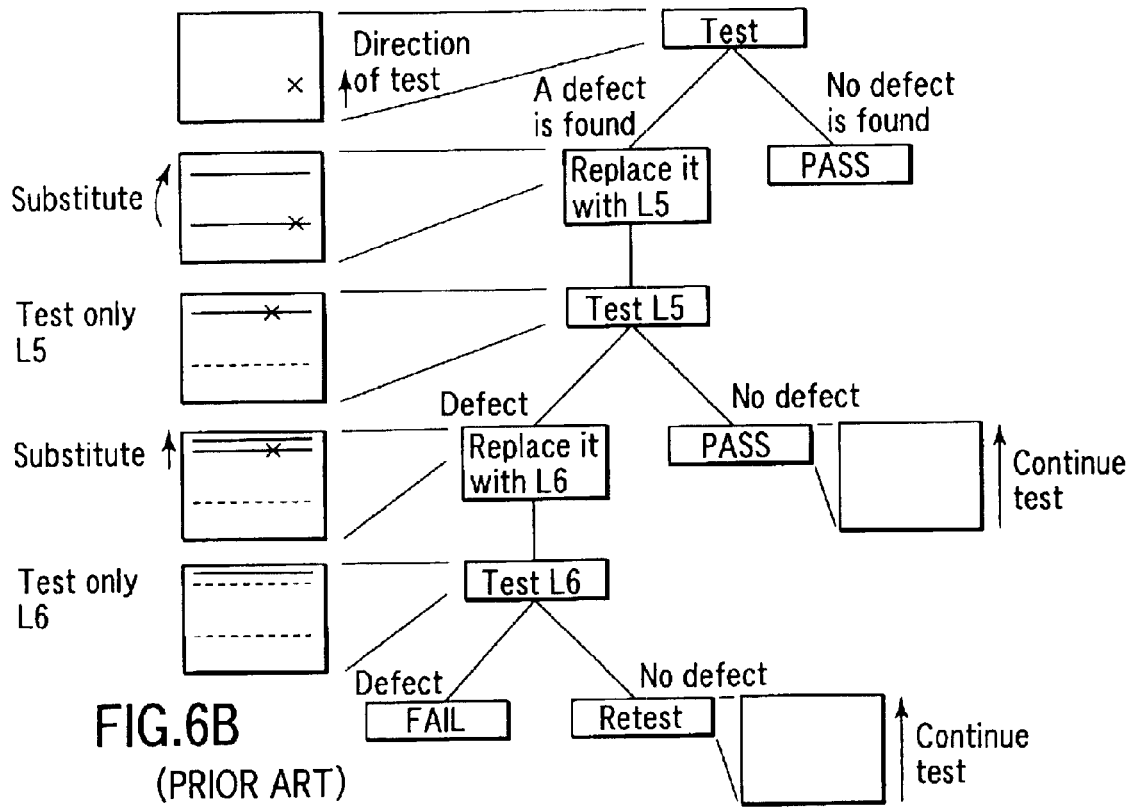
FIG. 6B is a schematic diagram showing a process of testing whether there is a defective memory cell in the redundancy system of the conventional semiconductor device.
Figure 6D:
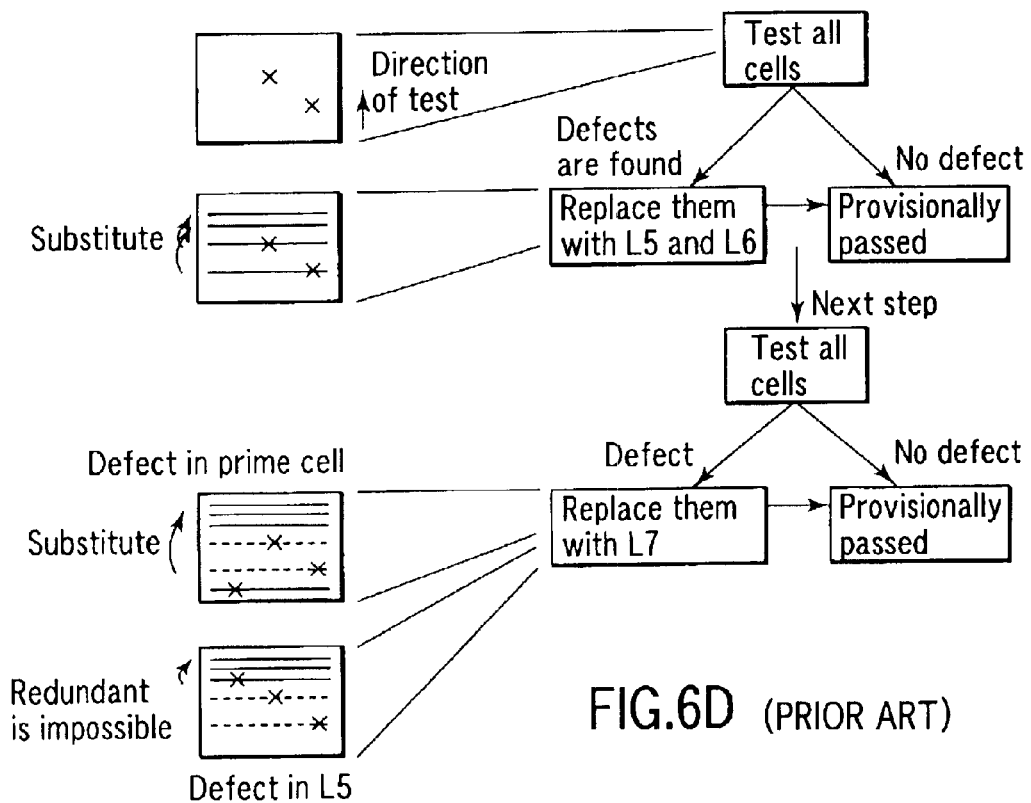
FIG. 6D is a schematic diagram showing a process of testing whether there is a defective memory cell in the redundancy system of the conventional semiconductor device.
Figure 6C:
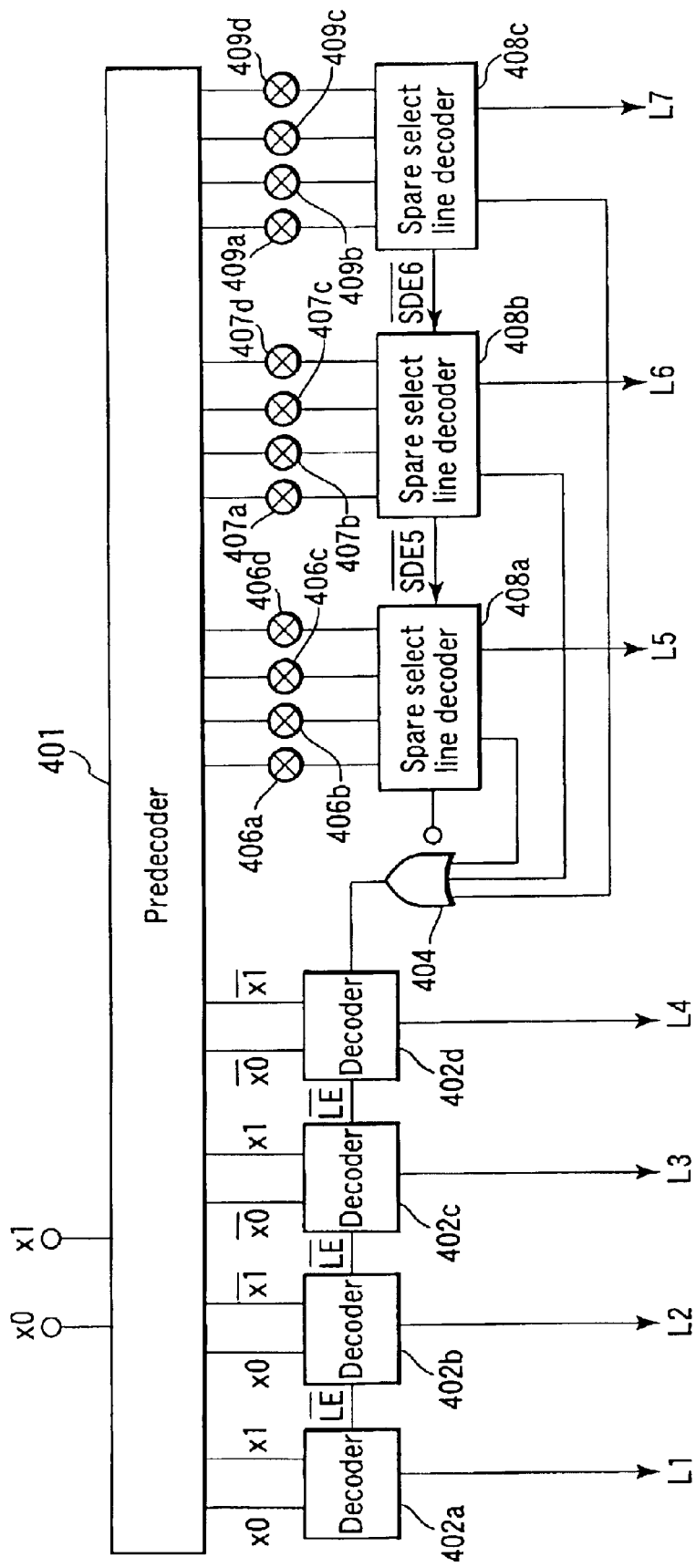
FIG. 6C is a block diagram showing a redundancy system of a conventional semiconductor device.

As described above, in the semiconductor memory device according to this embodiment, priorities are assigned to the redundant word lines RWL0 to RWLn. In addition, the second comparing circuits C0' to C(n-1)' and the disable circuits D0 to D(n-1) are provided in correspondence with the redundant word lines RWL0 to RWL(n-1) having the lower priority. The second comparing circuits C0' to C(n-1)' compare the defective addresses, held in the latch circuits L0 to L(n-1) corresponding to the redundant word lines RWL0 to RWL(n-1) having the lower priority, with the defective address held in the latch circuit Ln corresponding to the redundant word line RWLn having the higher priority. The disable circuit D0 to D(n-1) corresponding to the second comparing circuit C0' to C(n-1)', in which the result of the comparison is "match", disables the substitution command of the corresponding substituting circuit S0 to S(n-1). In other words, the substituting circuit S0 to S(n-1) itself is disabled, or the corresponding redundancy match line RML0 to RML(n-1) is disabled. Therefore, when the redundant word line RWLn having the hither priority is accessed, the access to the prime word lines and the other redundant word lines RWL0 to RWL(n-1) is inhibited. With this characteristic, even if a first redundant word line is substituted for a prime word line and thereafter a second redundant word line is substituted for the first redundant word line, access to the first redundant word line can be inhibited. Thus, multi-selection of redundant word lines can be prevented. Specifically, in the test described with reference to FIG. 6B in connection with the background art, multi-selection of a plurality of redundant word lines can be prevented. Moreover, multi-selection of a plurality of redundant word lines can be prevented without using means (the disable circuit DSB of the first embodiment) holding information as to whether the substituting circuit should be used. Consequently, the efficiency of recovering memory cells can be improved, while the increase in area of the semiconductor memory cell is avoided.

Figure 18A:
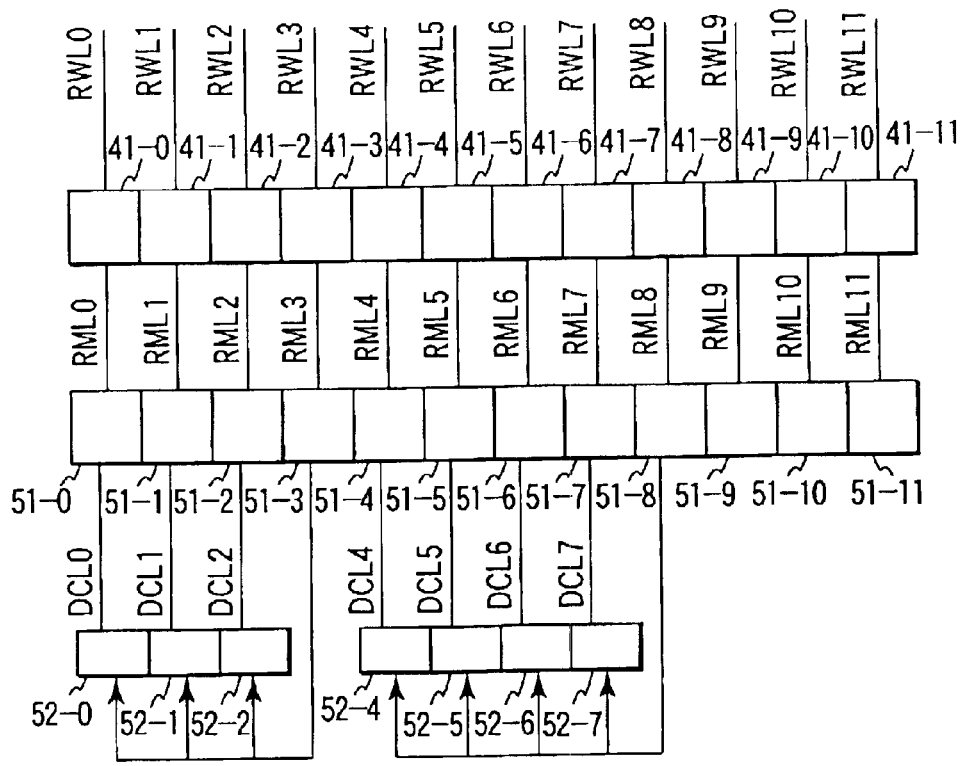
FIG. 18A is a schematic diagram showing a redundancy system of a semiconductor device according to a first modification of the second embodiment.

FIG. 18A is a block diagram of a row decoder R/D and a redundancy control circuit RDNT_CNT according to a first modification of this embodiment.

In this modification, the second control sections 52-0 to 52-2 are provided in correspondence with the first control sections 51-0 to 51-2. The second control sections 52-0 to 52-2 compare the defective addresses held in the first control section 51-0 to 51-2 with the defective address held in a first control section 51-3.

Further, second control sections 52-4 to 52-7 are provided in correspondence with first control sections 51-4 to 51-7. The second control sections 52-4 to 52-7 compare the defective addresses held in the first control section 51-4 to 51-7 with the defective address held in a first control section 51-8.

Thus, the above embodiment may be modified such that the redundant word line RWL3 is given a higher priority than the redundant word lines RWL0 to RWL2, and a redundant word line RWL8 is given a higher priority than redundant word lines RWL4 to RWL7. Furthermore, redundant word lines RWL9 to RWL11, having no priority with respect to the redundant word lines RWL0 to RWL8, may be provided.

Figure 18B:
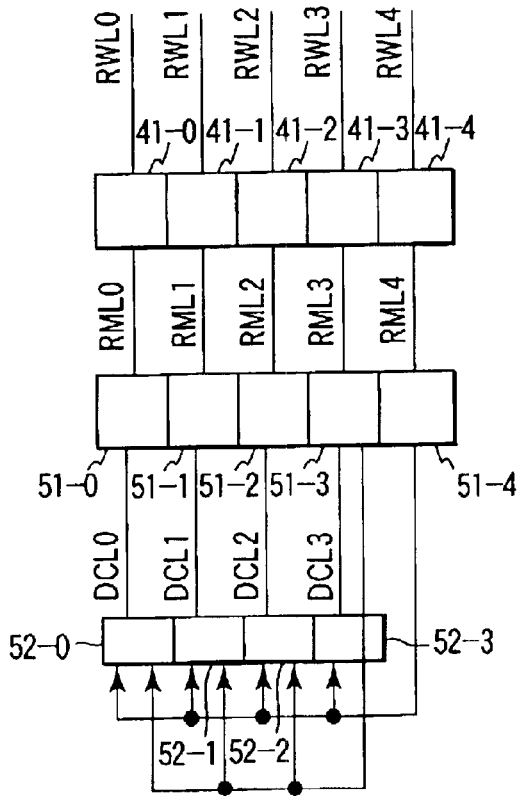
FIG. 18B is a schematic diagram showing a redundancy system of a semiconductor device according to a second modification of the second embodiment.

FIG. 18B is a block diagram of a row decoder R/D and a redundancy control circuit RDNT_CNT according to a second modification of this embodiment.

In this modification, the second control sections 52-0 to 52-3 are provided in correspondence with the first control sections 51-0 to 51-3. The second control section 52-3 compares the defective address held in the first control section 51-3 with the defective address held in a first control section 51-4. The second control sections 52-0 to 52-2 compare the defective addresses held in the first control section 51-0 to 51-2 with the defective address held in the first control section 51-4 and also compare them with the defective address held in the first control section 51-3.

Thus, the redundant word line RWL4 is given a higher priority than all redundant word lines RWL0 to RWL3. The redundant word line RWL3 is given a higher priority than the redundant word lines RWL0 to RWL2.

With this structure, the defective address detected in the first test can be held in the first control sections 51-0 to 51-2, the defective address detected in the second test can be held in the first control section 51-3, and the defective address detected in the third test can be held in the first control section 51-4. Consequently, even if two or more of the first control sections 51-0 to 51-2 and the first control sections 51-3 and 51-4 hold the same defective address, only the redundant word line RWL4 can be selected.

Figure 11B:
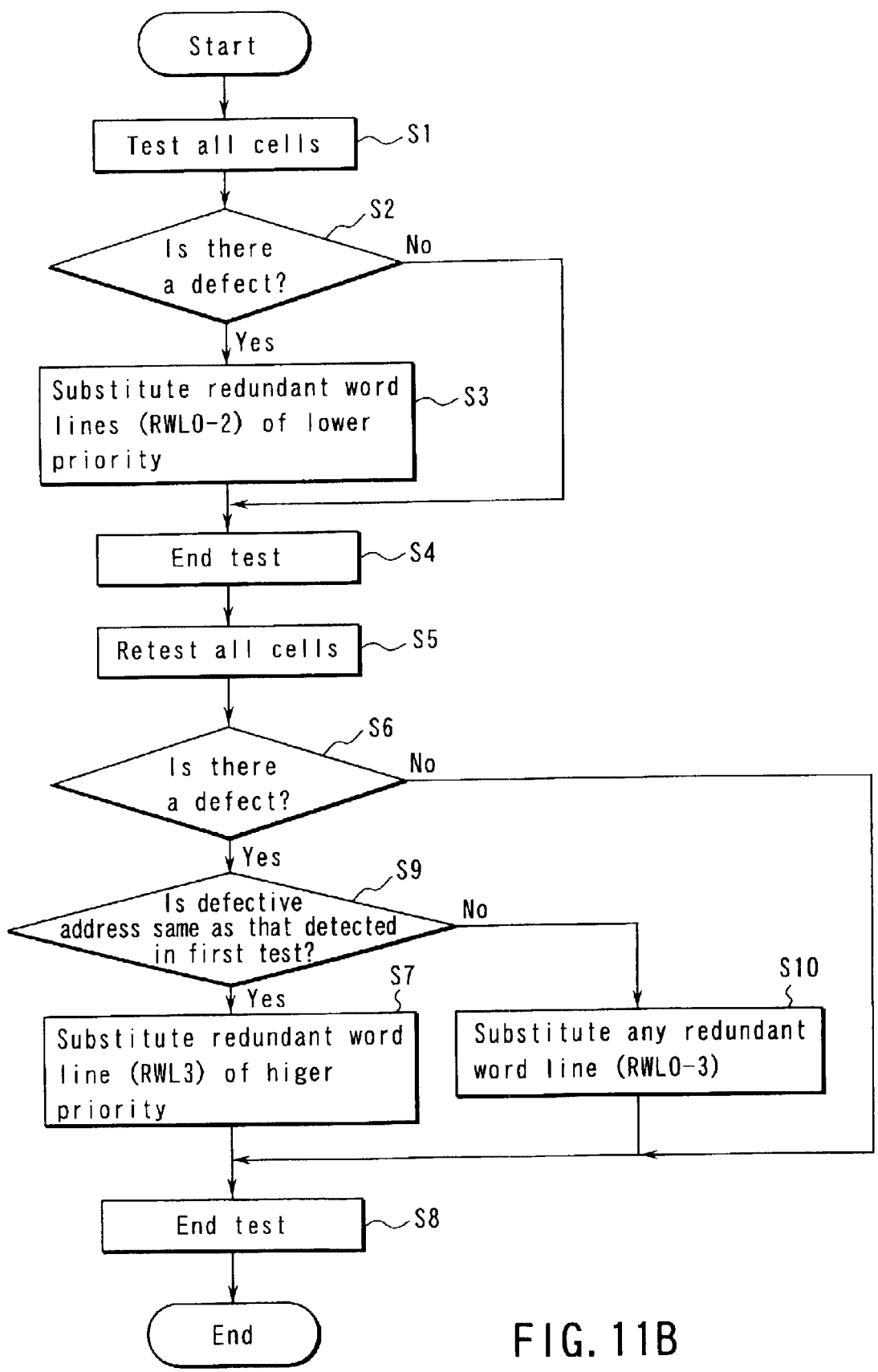

FIG. 11B is a flowchart showing a process of testing a semiconductor device according to a third modification of this embodiment.

According to this modification, when a defect is detected in the second test, it is determined whether the defective address is the same as that detected in the first test (a step S9). If it is determined to be the same, a redundant word line of the higher priority is substituted. If not, any spare redundant word line is substituted. Thus, in this modification, a redundant word line of the higher priority is not unconditionally substituted for the defective word line detected in the second test. A redundant word line of the higher priority is used when re-substitution is required.

With this modification, the semiconductor device can be remedied more efficiently.

Figure 19A:
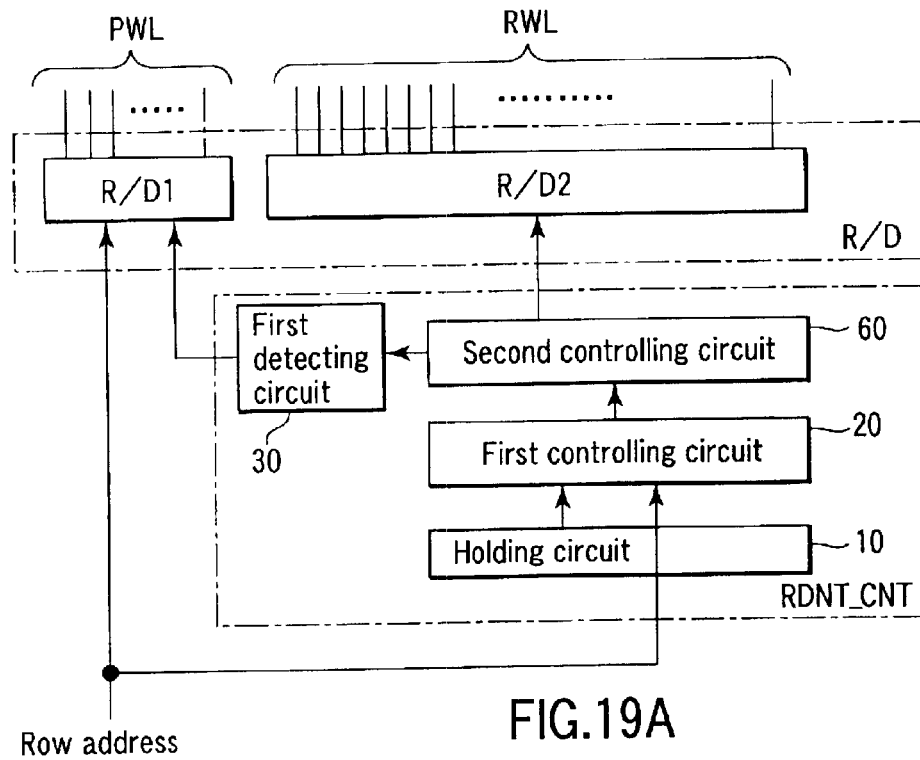
FIG. 19A is a block diagram showing a row decoder and a redundancy control circuit of a semiconductor device according to a third embodiment of the present invention.

A semiconductor device according to a third embodiment of the present invention will be described with reference to FIG. 19A. FIG. 19A is a block diagram showing the row decoder R/D and the redundancy control circuit RDNT_CNT of the semiconductor memory device shown in FIG. 7A. It shows details of the redundancy control circuit RDNT-CNT in particular.

As in the second embodiment, the redundancy control circuit RDNT_CNT comprises the holding circuit 10, the first and second controlling circuits 20 and 60, and the first detecting circuit 30, as shown in FIG. 19A.

The second controlling circuit 60 of this embodiment monitors the substitution command supplied from the first controlling circuit 20. When a plurality of substitution commands are supplied, the second controlling circuit 60 transmits only one of them to the row decoder R/D2.

Figure 19B:
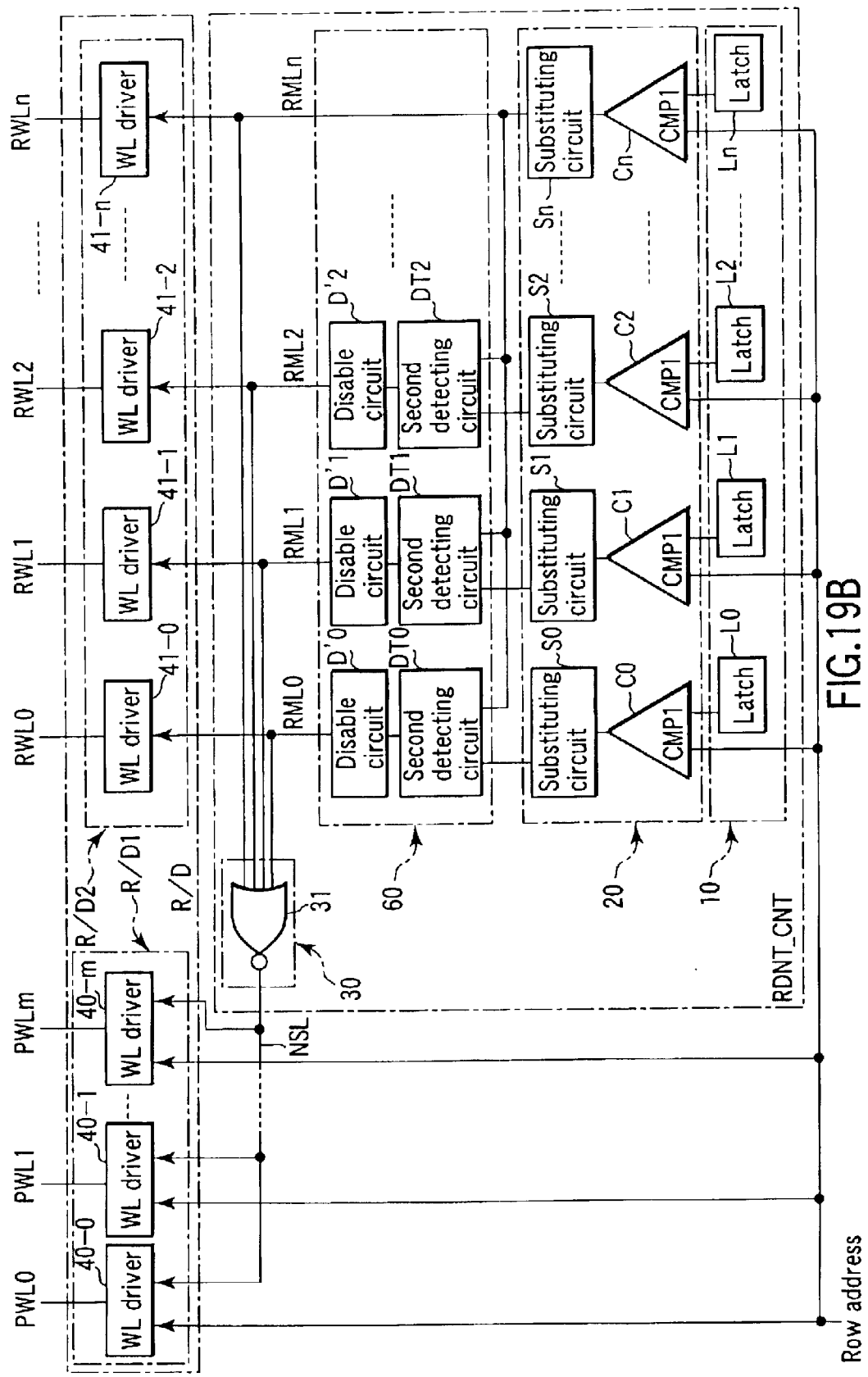
FIG. 19B is a circuit diagram showing a row decoder and the redundancy control circuit of the semiconductor device according to the third embodiment of the present invention.

FIG. 19B is a circuit diagram showing the row decoder R/D and the redundancy control circuit RDNT_CNT, which illustrates the structures of the row decoder R/D and the redundancy control circuit RDNT_CNT in more detail. In the semiconductor memory device according to this embodiment, priorities are assigned to the redundant word lines RWL0 to RWLn. The redundant word lines RWL0 to RWL(n−1) have the same priority and the redundant word line RWLn has a higher priority than that of the redundant word lines RWL0 to RWL(n−1).

The structure of the redundancy control circuit RDNT_CNT will now be described. Since the structures of the holding circuit 10, the first controlling circuit 20 and the first detecting circuit 30 are the same as those of the first embodiment, the descriptions thereof are omitted.

The second controlling circuit 60 comprises n second detecting circuits DT0 to DT(n−1) and n disable circuits D0' to D(n−1)'. The second detecting circuits DT0 to DT(n−1), as well as the latch circuits L0 to L(n−1), are provided in correspondence with the redundant word lines RWL0 to RWL(n−1). The second detecting circuits DT0 to DT(n−1) monitor the substitution commands supplied from the substituting circuits S0 to S(n−1) and the substitution command supplied from the substituting circuit Sn. Further, they detect whether both the substituting circuit Sn and any of the substituting circuits S0 to S(n−1) supply the substitution commands.

The disable circuits D0' to D(n−1)' are provided in correspondence with the redundant word line RWL0 to RWL(n−1). The disable circuits D0' to D(n−1)' respectively disable the substitution commands from the substituting circuits S0 to S(n−1) based on the results of detection in the respective second detecting circuits DT0 to DT2. In other words, the redundancy match lines RML0 to RML(n−1) are set to the "L" level.

Figure 19C:
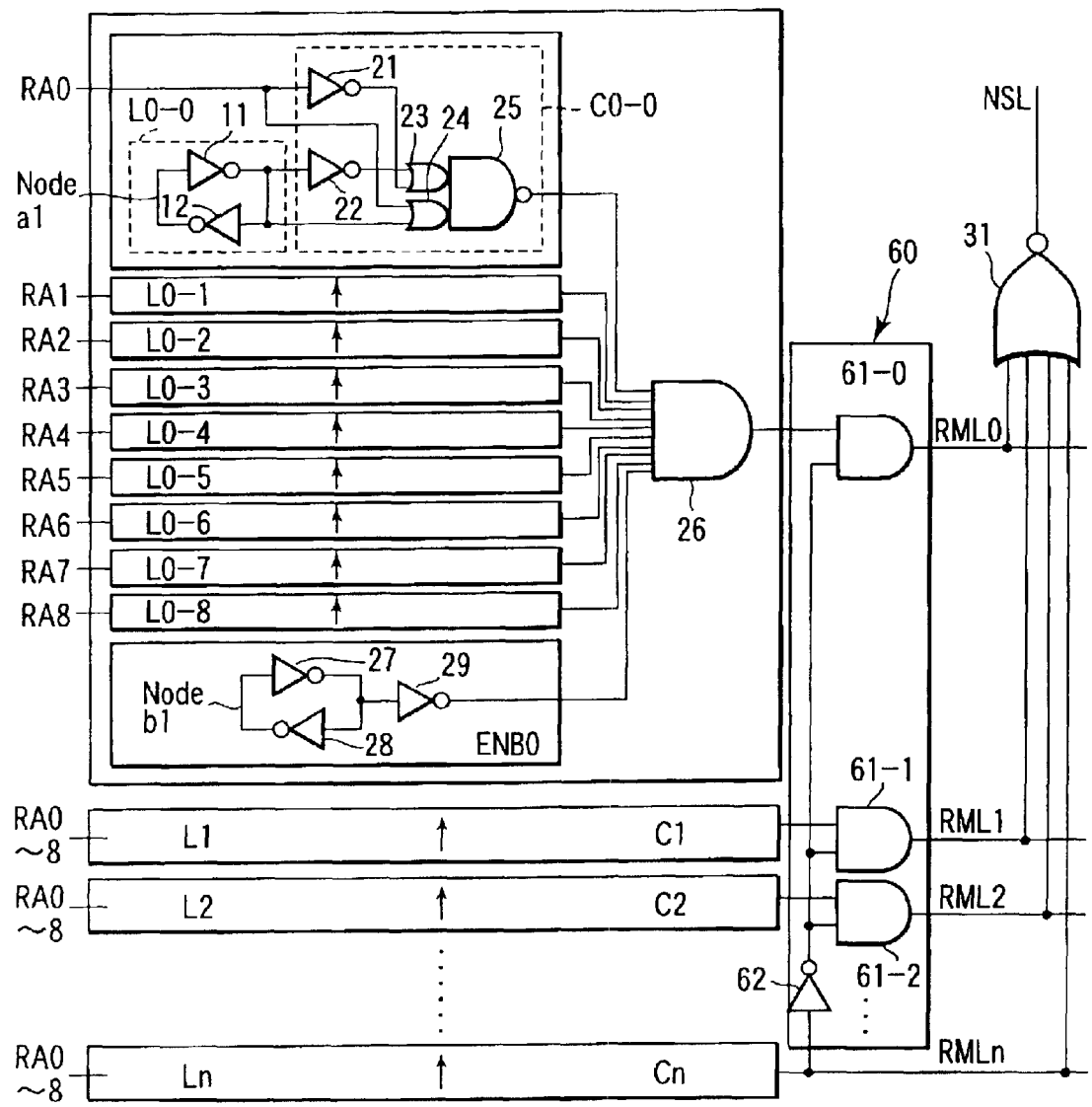
FIG. 19C is a circuit diagram showing a part of the redundancy control circuit of the semiconductor device according to the third embodiment.

FIG. 19C is a circuit diagram showing the structure of the redundancy control circuit RDNT_CNT in more detail. FIG. 19C shows details of only the structure corresponding to the redundancy match line RML0 in particular. The circuits corresponding to the other redundancy match lines RML1 to RMLn have the same structure as that of the redundancy match line RML0. FIG. 9C shows the case of a 9-bit row address.

As shown in FIG. 19C, the latch circuits L0 to Ln and first comparing circuits C0 to Cn are the same as those of the first embodiment. The substituting circuits S0 to Sn are the same as those of the first embodiment except that that the disable circuits DSB0 to DSBn are eliminated. Therefore, descriptions of these elements are omitted.

The second detecting circuits DT0 to DT(n−1) and the disable circuits D0' to D(n−1)' of the second controlling circuit 60 are realized by the combination of AND gates 61-0 to 61-(n−1) and an inverter 62. An output node of the substituting circuit Sn corresponding to the redundancy word line RWLn having the higher priority is directly connected to the redundancy match line RMLn. The substitution command from the substituting circuit Sn is directly input to the redundancy word line driver 41-n.

The inverter 62 inverts the substitution command signal output from the substituting circuit Sn. Output nodes of the substituting circuits S0 to S(n−1) are respectively connected to input nodes of the AND gates 61-0 to 61-(n−1). An output node of the inverter 62 is also connected to the input nodes of the AND gates 61-0 to 61-(n−1). Output nodes of the AND gates 61-0 to 61-(n−1) are connected to the redundancy match lines RML0 to RML(n−1). Thus, each of the AND gates 61-0 to 61-(n−1) carries out the logical AND between the substitution command from the corresponding substituting circuit S0 to S(n−1) and the inverted signal of the substitution command from the substituting circuit Sn, and supplies the result to the corresponding redundancy match line RML0 to RML(n−1).

Therefore, when the substituting circuit Sn outputs the substitution command and the redundancy match line RMLn is set to the "H" level, the outputs of the AND gates 61-0 to 61-(n−1) are set at the "L" level regardless of the output of the substituting circuits S0 to S(n−1). Thus, all the redundancy match lines RML0 to RML(n−1) are set to the "L" level.

Figure 20:
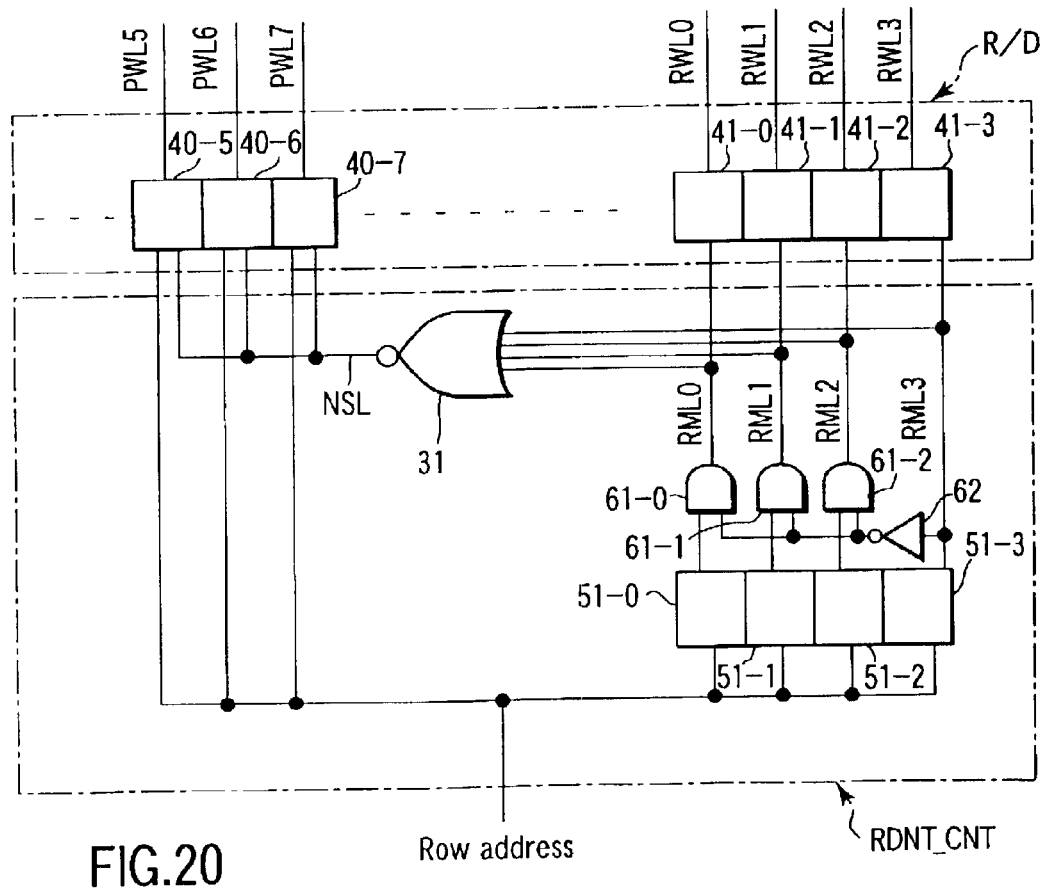
FIG. 20 is a schematic diagram showing a redundancy system of the semiconductor device according to the third embodiment.
Figure 21:
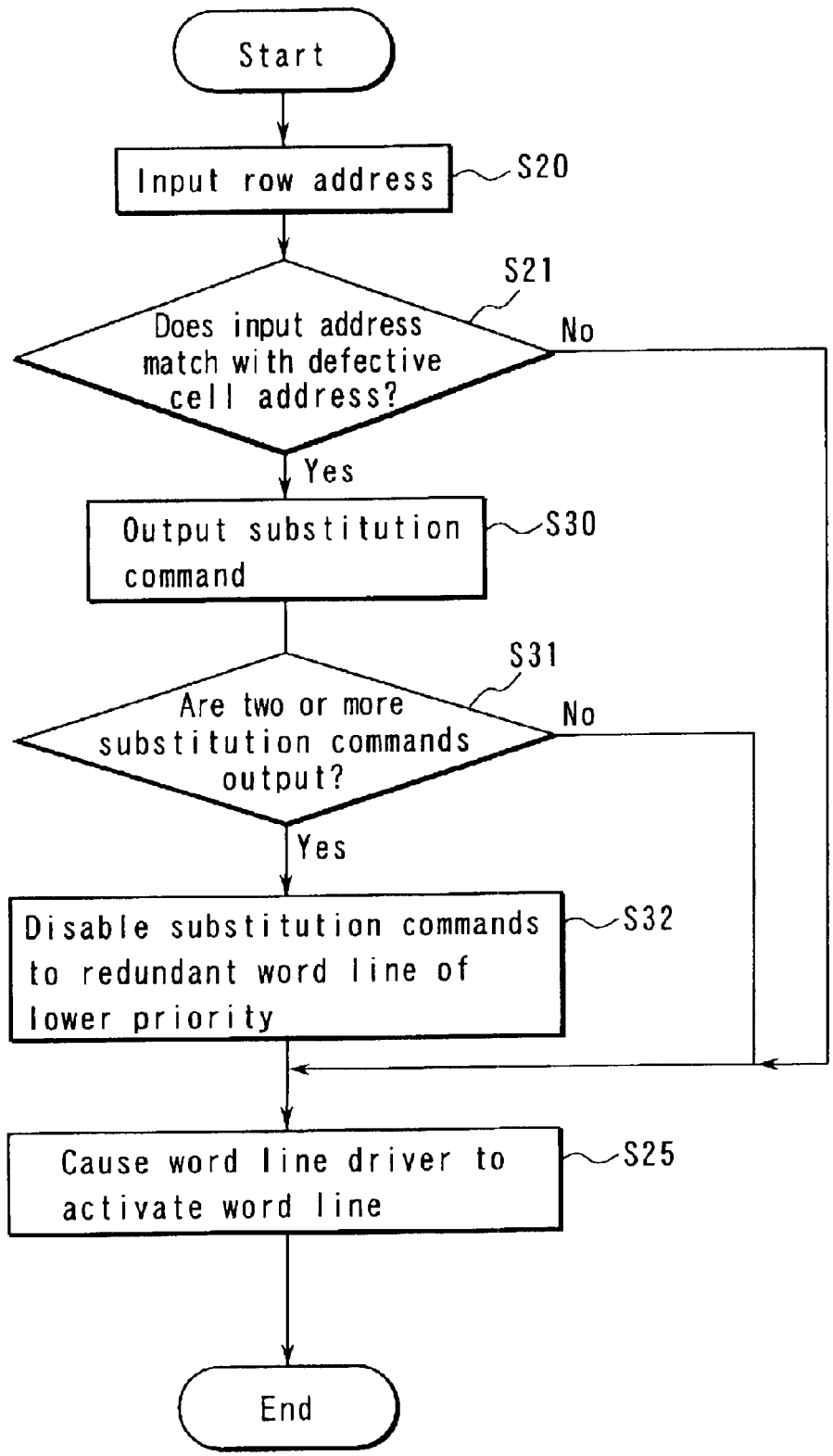
FIG. 21 is a flowchart showing a process executed when a defective memory cell is accessed in the redundancy system of the semiconductor device according to the third embodiment.
Figure 22A:
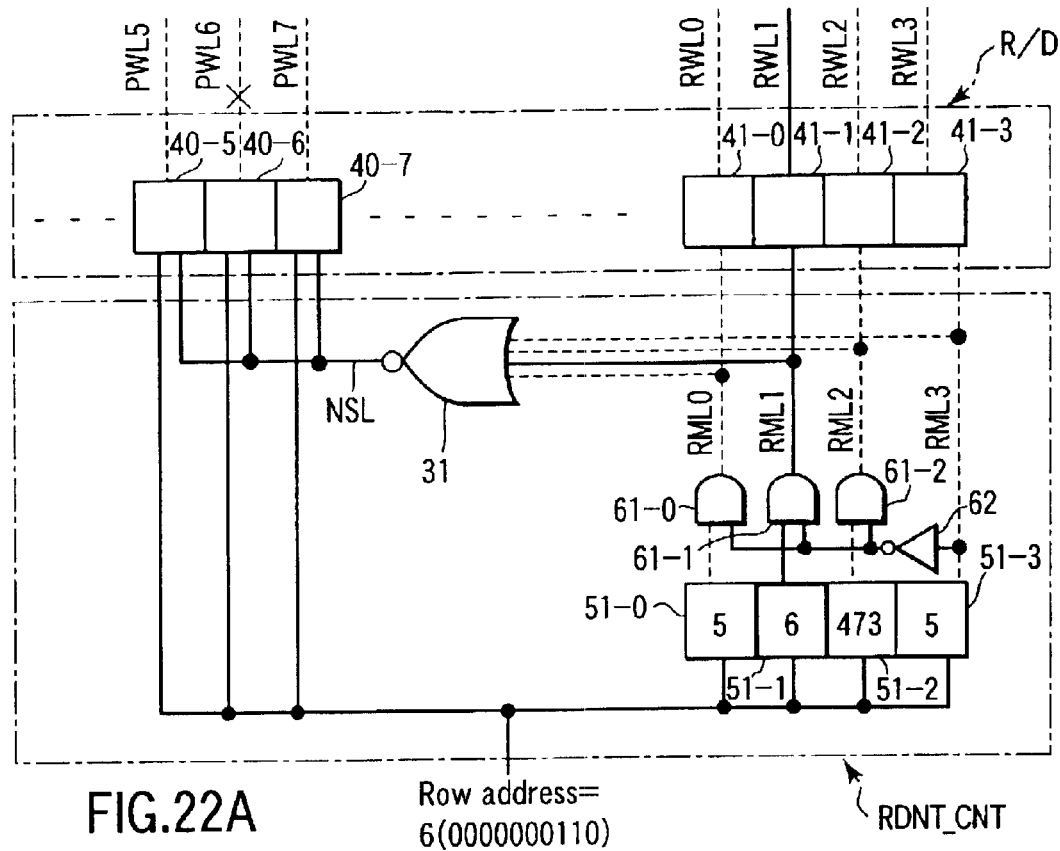
FIG. 22A is a schematic diagram showing the redundancy system of the semiconductor device according to the third embodiment, in which a defective memory cell is accessed.
Figure 22B:
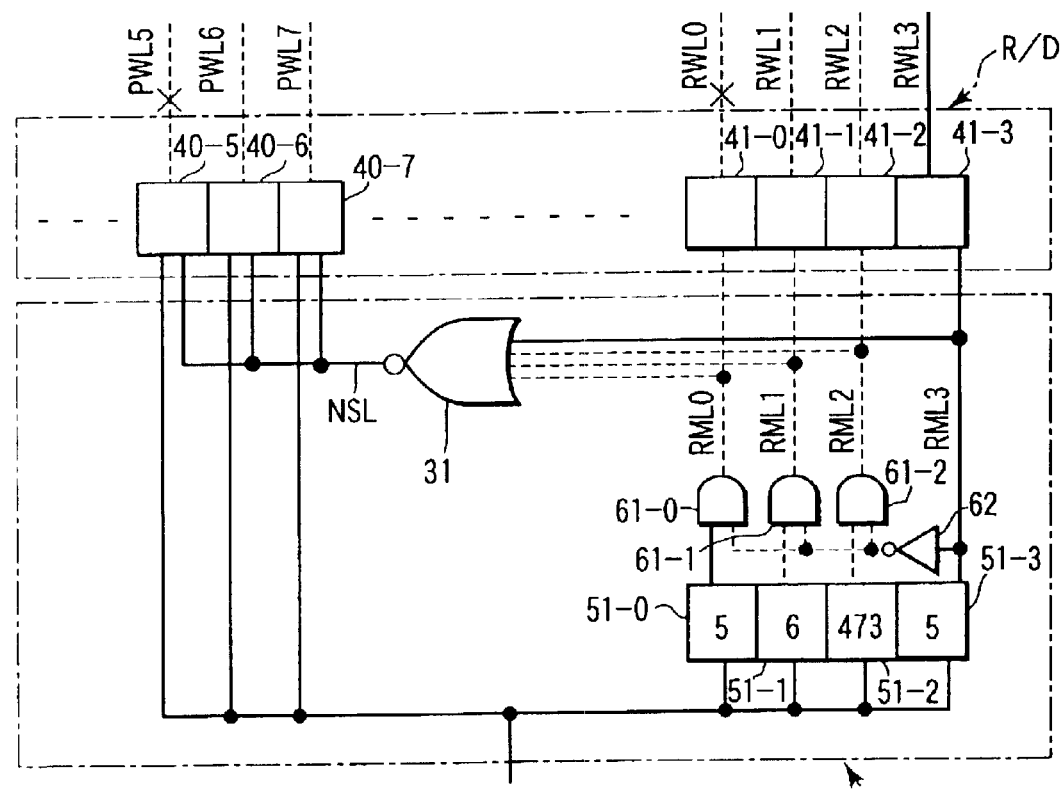
FIG. 22B is a schematic diagram showing the redundancy system of the semiconductor device according to the third embodiment, in which a defective memory cell is accessed.

A method for recovering the semiconductor memory device according to this embodiment will be described with reference to FIGS. 20, 21, 22A and 22B. FIGS. 20, 22A and 22B are block diagrams showing the row decoder R/D and the redundancy control circuit RDNT_CNT, in particular, which schematically show the redundancy system of the semiconductor device according to this embodiment. To make the explanation simple, it is assumed that the semiconductor device has four redundant word lines RWL. It is also assumed that the redundant word lines RWL0 to RWL2 have the same priority and the redundant word line RWL3 has a higher priority than that of the redundant word lines RWL0 to RWL2. To simplify the diagrams, as shown in FIG. 20, the combinations of the substituting circuits S0 to S3, the first comparing circuits C0 to C3 and the latch circuits L0 to L3, corresponding to the redundancy match lines RML0 to RML3, are respectively called first control sections 51-0 to 51-3. FIG. 21 is a flowchart showing a process for accessing the semiconductor memory device according to this embodiment.

The testing method is the same as that of the second embodiment described above with reference FIGS. 11A and 11B. Therefore, the description thereof is omitted.

During an access time, first, a row address is input to the redundancy control circuit RDNT_CNT through the row control circuit ROW_CNT (FIG. 21, a step S20). If the input row address does not match with any defective addresses (a step S21), the prime word line PWL0 to PWLm corresponding to the row address is activated by the corresponding prime word line driver 40-1 to 40-m (a step S25), as in the first and second embodiments.

If the input row address matches with a defective address (a step S21), at least one of the first control section 51-0 to 51-3 outputs the substitution command. As shown in FIG. 22A, if the input address is 6, the first control section 51-1 outputs the substitution command. The first control sections 51-0, 51-2 and 51-3 do not output the substitution command, since the row address does not match with the defective addresses held therein.

Thereafter, it is determined whether a plurality of substitution commands are output (a step S31). If one substitution command is output, the "H" level signal is output to the corresponding redundancy match line RML0 to RML3. Accordingly, the corresponding redundant word line driver 41-0 to 41-3 activates the corresponding redundant word line RWL0 to RWL3 (a step S25).

On the other hand, if a plurality of substitution commands are output, i.e., if the input address matches with the defective address in two or more of the first control sections 51-0 to 51-3 and these first control sections output the substitution commands, the following process is performed: the AND gates 61-0 to 61-2 disable the substitution commands output from the first control sections 51-0 to 51-2 corresponding to the redundant word lines RWL0 to RWL2 of the lower priority (a step S32). As a result, only the substitution command, output from the first control section 51-3 corresponding to the redundant word line RWL3 of the higher priority, is enabled. Accordingly, only the redundant word line RWL3 is activated by the redundant word line driver 41-3.

The case, in which only one control section outputs the substitution command in the step S31, will be described in detail with reference to FIG. 22A. In the example shown in FIG. 22A, the row address 6 is input. In this case, the first control sections 51-0, 51-2 and 51-3 do not output the substitution commands, that is, they outputs the "L" level signals. Therefore, the redundancy match line RML3 directly connected to the first control section 51-3 is at the "L" level. Accordingly, the redundant word line driver 41-3 does not activate the redundant word line RWL3. The outputs of the AND gates 61-0 and 61-2 are also at the "L" level. Therefore, since the redundancy match lines RML0 and RML2 are at the "L" level, the redundant word line drivers 41-0 and 41-2 do not activate the redundant word lines RWL0 and RWL2. On the other hand, only the first control section 51-1 outputs the substitution command, i.e., the "H" level signal. Since the redundancy match line RML3 is at the "L" level, the inverter 62 outputs the "H" level signal. As a result, the AND gate 61-1 outputs the "H" level signal to the redundancy match line RML1. Accordingly, the redundant word line driver 41-1 activates the redundant word line RWL1. Since the redundancy match line RML1 is at the "H" level, the prime word line non-select line NSL is at the "L" level. Therefore, the prime word line driver 40-6 does not activate the prime word line PWL6.

Consequently, only the redundant word line RWL1 is activated.

The case, in which two or more control sections output the substitution command in the step S31, will now be described in detail with reference to FIG. 22B. In the example shown in FIG. 22B, the row address 5 is input. In this case, the first control sections 51-0 and 51-3 output the substitution commands, that is, the redundancy match line RML3 is set at the "H" level. Therefore, the redundant word line driver 41-3 activates the redundant word line RWL3. Further, since the redundancy match line RML3 is at the "H" level, the output of the inverter 62 is at the "L" level. In this case, although the first control section 51-0 outputs the substitution command, i.e., the "H" level signal, the output of the AND gate 61-0 is at the "L" level and the redundancy match line RML0 is at the "L" level. Therefore, the redundant word line driver 41-0 does not activate the redundant word line RWL0. Naturally, since the output of the inverter 62 is at the "L" level and the first control sections 51-1 and 51-2 do not output the substitution commands, the redundant word lines RWL1 and RWL2 are not activated. Further, since the redundancy match line RML3 is at the "H" level, the prime word line driver 40-5 does not activate the prime word line PWL5.

Thus, when the row address 5 is accessed, there are three word lines corresponding to the row address 5: the defective prime word line PWL5, the defective redundant word line RWL0 and the normal redundant word line RWL3. However, the access to the prime word line PWL5 is inhibited by setting the prime word line non-select line NSL to the "L" level, and the access to the redundant word line RWL0 is inhibited by setting the redundancy match line RML0 to the "L" level. As a result, only the normal redundant word line RWL3 is accessed.

As described above, in the semiconductor memory device according to this embodiment, priorities are assigned to the redundant word lines RWL0 to RWLn. In addition, the second detecting circuits DT0 to DT(n−1) and the disable circuits D0' to D(n−1)' are provided in correspondence with the redundant word lines RWL0 to RWL(n−1) having the lower priority. The second detecting circuits DT0 to DT(n−1) and the disable circuits D0' to D(n−1)' unconditionally disable the substitution commands output from the substituting circuits S0 to S(n−1) corresponding to the redundant word lines RWL0 to RWL(n−1) having the lower priority, when the substitution circuit Sn corresponding to the redundant word line RWLn having the higher priority outputs the substitution command. In other words, the substituting circuits S0 to S(n−1) are disabled, or the corresponding redundancy match lines RML0 to RML(n−1) are disabled. Therefore, when the redundant word line RWLn having the hither priority is accessed, the access to the prime word lines and the other redundant word lines RWL0 to RWL(n−1) is inhibited. With this characteristic, as in the first embodiment, even if a first redundant word line is substituted for a prime word line and thereafter a second redundant word line is substituted for the first redundant word line, access to the first redundant word line can be inhibited. Thus, multi-selection of redundant word lines can be prevented. Moreover, multi-selection of a plurality of redundant word lines can be prevented without using means (the disable circuit DSB of the first embodiment) holding information as to whether the substituting circuit should be used. Consequently, the efficiency of recovering the semiconductor device can be improved, while the increase in area of the semiconductor memory cell is avoided.

Figure 23A:
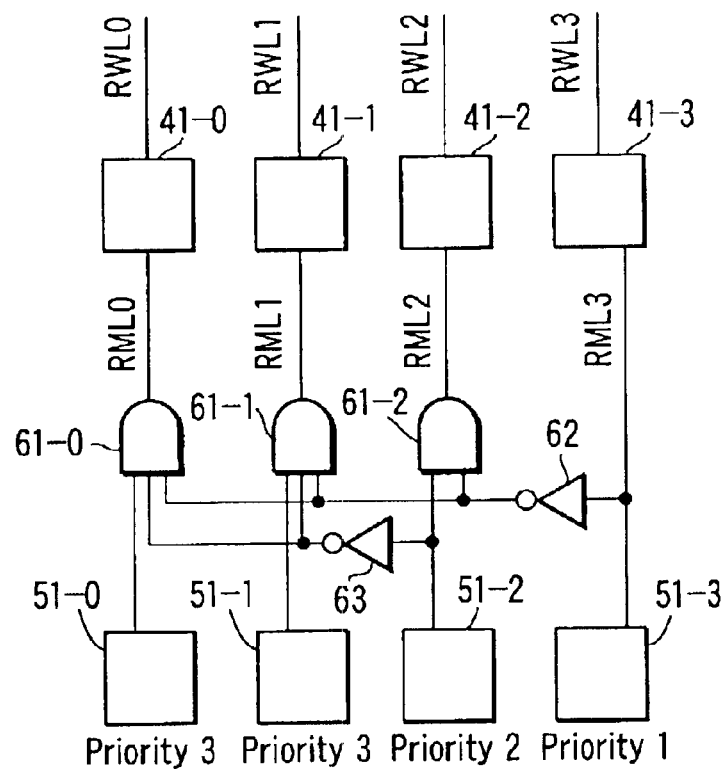
FIG. 23A is a schematic diagram showing a is redundancy system of a semiconductor device according to a first modification of the third embodiment.

FIG. 23A is a block diagram of a row decoder R/D and a redundancy control circuit RDNT_CNT according to a first modification of this embodiment.

In this modification, the AND gates 61-0 to 61-2 are provided in correspondence with the redundancy match the lines RML0 to RML2. The inverter 62 for inverting the substitution command output from the first control section 51-3 and the inverter 63 for inverting the substitution command output from the first control section 51-2 are also provided. The AND gate 61-0 carries out the logical AND between the substitution command output from the first control section 51-0 and the outputs from the inverters 62 and 63, and it outputs the result of the operation to the redundancy match line RML0. The AND gate 61-1 carries out the logical AND between the substitution command output from the first control section 51-1 and the outputs from the inverters 62 and 63, and it outputs the result of the operation to the redundancy match line RML1. The AND gate 61-2 carries out the logical AND between the substitution command output from the first control section 51-2 and the output from the inverter 62, and it outputs the result of the operation to the redundancy match line RML2. The substitution command output from the first control section 51-3 is directly output to the redundancy match line RML3.

Therefore, when the first control section 51-3 outputs the substitution command, only the redundancy match line RML3 is at the "H" level, while the other redundancy match lines RML0 to RML2 are at the "L" level. Accordingly, only the redundant word line RWL3 is activated, while the other redundant word lines RWL1 to RWL2 are not. When the first control section 51-3 does not output the substitution command and the first control section 51-2 outputs the substitution command, only the redundancy match line RML2 is at the "H" level, while the other redundancy match lines RML0, RML1 and RML3 are at the "L" level. Accordingly, only the redundant word line RWL 2 is activated, while the redundant word lines RWL0, RWL1 and RWL3 are not.

Thus, with the structure shown in FIG. 23A, the substitution command from the first control section 51-3 (or the redundancy match line RML3 and the redundant word line RWL3) is given a higher priority than the substitution commands from the first control sections 51-0 to 51-2 (or the redundancy match lines RML0 to RML2 and the redundant word lines RWL0 to RWL2). Further, the substitution command from the first control section 51-2 (or the redundancy match line RML2 and the redundant word line RWL2) is given a higher priority than the substitution commands from the first control sections 51-0 and 51-1 (or the redundancy match lines RML0 and RML1 and the redundant word lines RWL0 and RWL1).

According to this modification, three priorities are assigned to the redundant word lines. The redundant word lines RWL0 and RWL1 having the lowest priority can be substituted for defective word lines detected in the first test. The redundant word line RWL2 having the second priority can be substituted for a defective word line detected in the second test. The redundant word line RWL3 having the highest priority can be substituted for a defective word line detected in the third test. With this substitution method, multi-selection of redundant word lines can be avoided. If three redundant word lines are required in the first test, the redundant word lines RWL0 to RWL2 may be used, and the redundant word line RWL3 may be used in the second and subsequent tests. Thus, multi-selection of redundant word lines can be avoided.

Figure 23B:
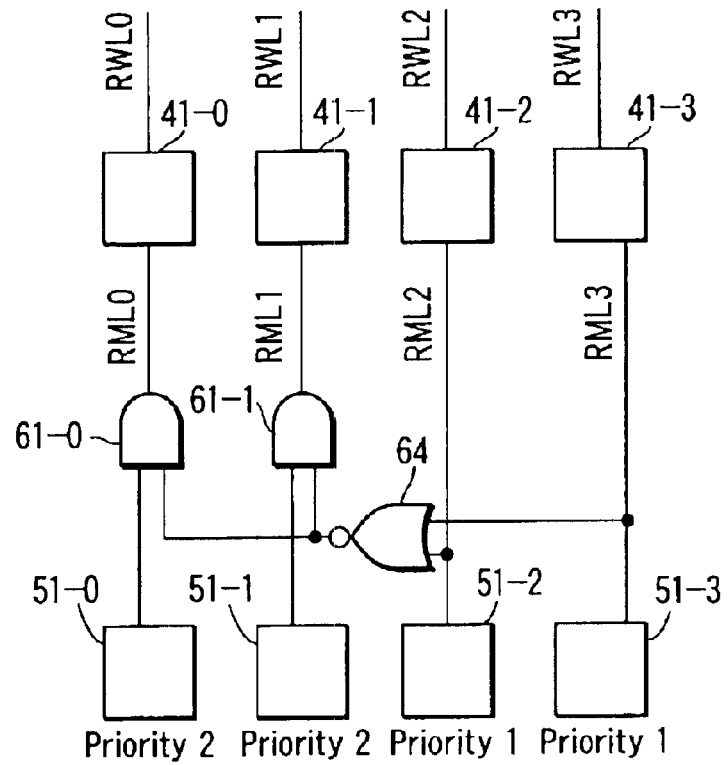
FIG. 23B is a schematic diagram showing a redundancy system of a semiconductor device according to a second modification of the third embodiment.

FIG. 23B is a block diagram of a row decoder R/D and a redundancy control circuit RDNT_CNT according to a second modification of this embodiment.

In this modification, the AND gates 61-0 and 61-1 are provided in correspondence with the redundancy match the lines RML0 and RML1. Further, a NOR gate 64, which carries out the logical NOR between the substitution commands outputs from the first control sections 51-2 and 51-3, is provided. The AND gate 61-0 carries out the logical AND between the substitution signal output from the first control section 51-0 and the output from the NOR gate 64, and outputs the result of the operation to the redundancy match line RML0. The AND gate 61-1 carries out the logical AND between the substitution signal output from the first control section 51-1 and the output from the NOR gate 64, and outputs the result of the operation to the redundancy match line RML1. The substitution commands output from the first control sections 51-2 and 51-3 are directly output to the redundancy match lines RML2 and RML3, respectively.

If the first control section 51-2 or 51-3 outputs the substitution command, the output of the NOR gate 64 is set to the "L" level. Therefore, both the redundancy match lines RML0 and RML1 are forcibly set to the "L" level. Consequently, neither of the redundant word lines RWL0 and RWL1 is activated.

Thus, with the structure shown in FIG. 23B, the substitution commands from the first control sections 51-2 and 51-3 (or the redundancy match lines RML2 and RML3 and the redundant word lines RWL2 and RWL3) are given a higher priority than the substitution commands from the first control sections 51-0 and 51-1 (or the redundancy match lines RML0 and RML1 and the redundant word lines RWL0 and RWL1).

According to this modification, there are a plurality of redundant word lines having the higher priority. Therefore, the redundant word lines can be substituted for a plurality of defective word lines detected in the second test. More specifically, the redundant word lines RWL0 and RWL1 are substituted for defective word lines detected in the first test, and the redundant word lines RWL2 and RWL3 are substituted for defective word lines detected in the second test. With this substitution method, multi-selection of redundant word lines can be avoided.

Figure 23C:
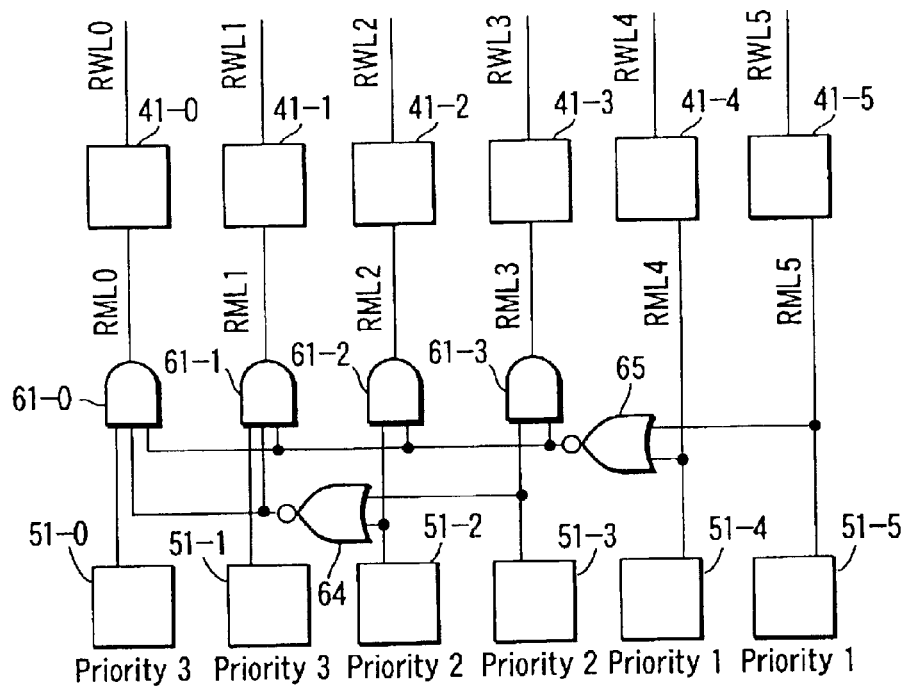
FIG. 23C is a schematic diagram showing a redundancy system of a semiconductor device according to a third modification of the third embodiment.

FIG. 23C is a block diagram of a row decoder R/D and a redundancy control circuit RDNT_CNT according to a third modification of this embodiment. This modification is the combination of the first and second modifications.

In this modification, the AND gates 61-0 to 61-3 are provided in correspondence with the redundancy match the lines RML0 to RML3. Further, the NOR gate 64, which carries out the logical NOR between the substitution commands output from the first control sections 51-2 and 51-3, is provided. A NOR gate 65, which carries out the logical NOR between the substitution commands output from first control sections 51-4 and 51-5, is also provided. The AND gate 61-0 carries out the logical AND between the substitution signal output from the first control section 51-0 and the outputs from the NOR gates 64 and 65, and outputs the result of the operation to the redundancy match line RML0. The AND gate 61-1 carries out the logical AND between the substitution signal output from the first control section 51-1 and the outputs from the NOR gates 64 and 65, and outputs the result of the operation to the redundancy match line RML1. The AND gate 61-2 carries out the logical AND between the substitution signal output from the first control section 51-2 and the output from the NOR gate 65, and outputs the result of the operation to the redundancy match line RML2. The AND gate 61-3 carries out the logical AND between the substitution signal output from the first control section 51-3 and the output from the NOR gate 65, and outputs the result of the operation to the redundancy match line RML3. The substitution commands output from the first control sections 51-4 and 51-5 are directly output to redundancy match lines RML4 and RML5, respectively.

If the first control section 51-4 or 51-5 outputs the substitution command, the output of the NOR gate 65 is set to the "L" level. Therefore, all the redundancy match lines RML0 to RML3 are forcibly set to the "L" level. Consequently, none of the redundant word lines RWL0 to RWL3 is activated. If neither of the first control sections 51-4 and 51-5 outputs the substitution command and the first control section 51-2 or 51-3 outputs the substitution command, the output of the NOR gate 64 is set to the "L" level. Therefore, both the redundancy match lines RML0 and RML1 are forcibly set to the "L" level. Consequently, neither of the redundant word lines RWL0 and RWL1 is activated.

Thus, with the structure shown in FIG. 23C, the substitution commands from the first control sections 51-4 and 51-5 (or the redundancy match lines RML4 and RML5 and the redundant word lines RWL4 and RWL5) are given a higher priority than the substitution commands from the first control sections 51-0 to 51-3 (or the redundancy match lines RML0 to RML3 and the redundant word lines RWL0 to RWL3). Further, the substitution commands from the first control sections 51-2 and 51-3 (or the redundancy match lines RML2 and RML3 and the redundant word lines RWL2 and RWL3) are given a higher priority than the substitution commands from the first control sections 51-0 and 51-1 (or the redundancy match lines RML0 and RML1 and the redundant word lines RWL0 and RWL1).

According to this modification, three priorities are assigned to the redundant word lines. In addition, there are a plurality of redundant word lines having the higher priority. The redundant word lines RWL0 and RWL1 having the lowest priority can be substituted for defective word lines detected in the first test. The redundant word lines RWL2 and RWL3 having the second priority can be substituted for defective word lines detected in the second test. The redundant word lines RWL4 and RWL5 having the highest priority can be substituted for defective word lines detected in the third test. With this substitution method, multi-selection of redundant word lines can be avoided. If three or four redundant word lines are required in the first test, the redundant word lines RWL0 to RWL3 may be used, and the redundant word lines RWL4 and RWL5 may be used in the second and subsequent tests. Thus, multi-selection of redundant word lines can be avoided.

Figure 23D:
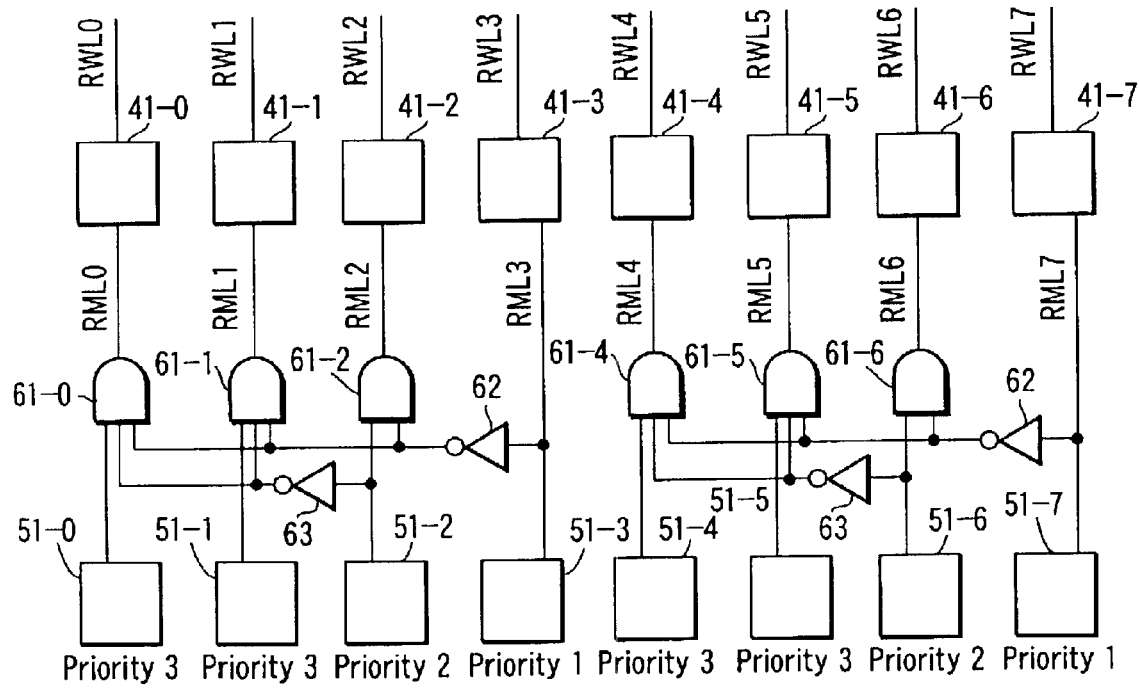
FIG. 23D is a schematic diagram showing a redundancy system of a semiconductor device according to a fourth modification of the third embodiment.

FIG. 23D is a block diagram of a row decoder R/D and a redundancy control circuit RDNT_CNT according to a fourth modification of this embodiment.

As shown in FIG. 23D, the row decoder R/D and the redundancy control circuit RDNT_CNT may be formed of the combination of a plurality of structures shown in FIG. 23A. Naturally, they may be formed of the combination of a plurality of structures shown in FIG. 23B or 23C, or the combination of the structures shown in FIGS. 23A to 23C.

As described above, according to the first to third embodiments of the present invention, in the case of re-substitution using redundant word lines, occurrence of multi-selection of redundant word lines can be suppressed.

According to the first embodiment of the present invention, each redundant word line is provided with a disable circuit DSB, which holds information as to whether the redundant word line should be used or not. The disable circuit corresponding to a redundant word line, which includes a defect, holds information representing that the redundant word line should not be used. Therefore, access to the defective redundant word line is inhibited, thereby suppressing multi-selection of redundant word lines. In addition, since the disable circuit DSB is formed of a latch circuit, the number of fuses can be reduced and the area of the semiconductor memory device can be reduced as compared to the conventional device.

Figure 24A:
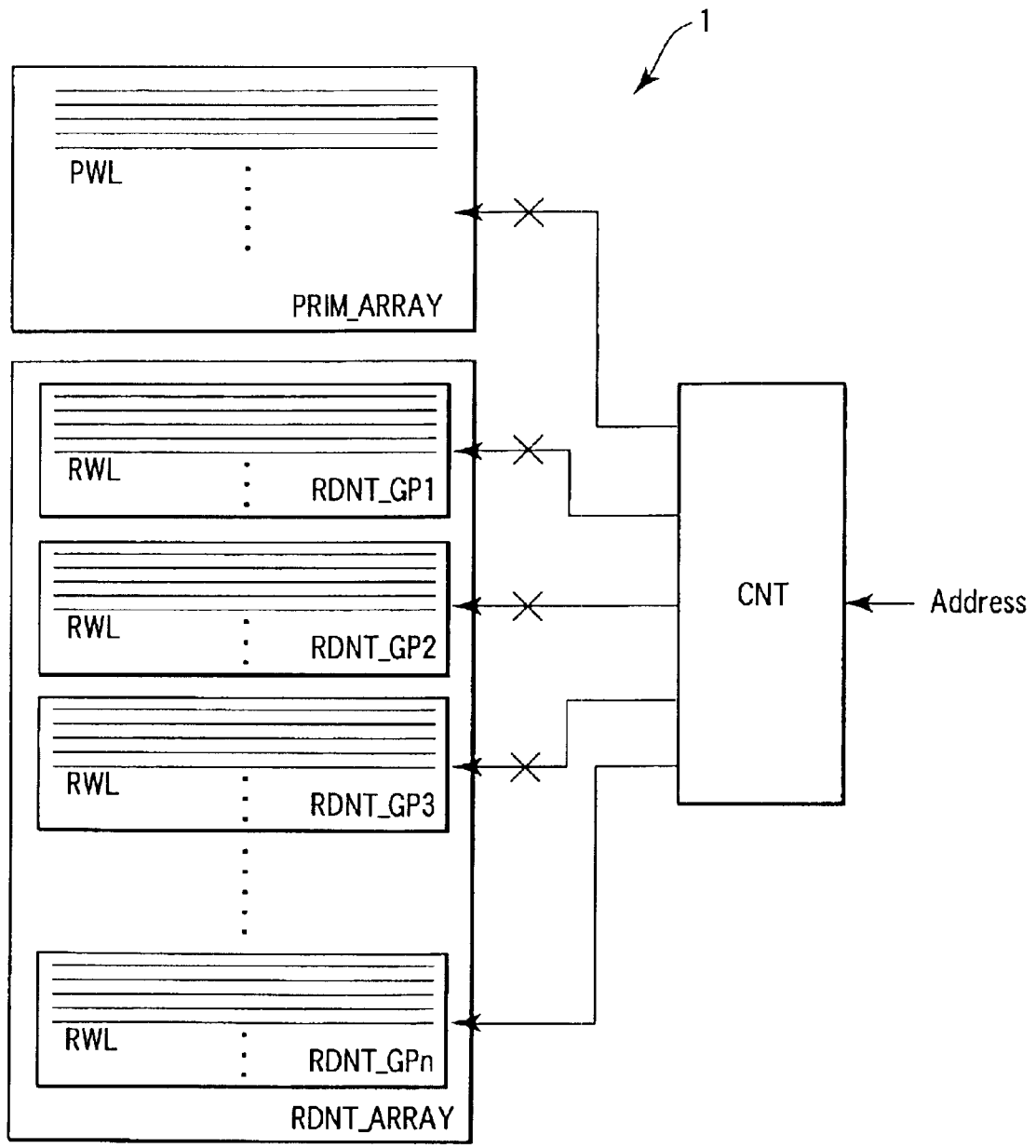
FIG. 24A is a block diagram showing a semiconductor device according to the second and third embodiments of the present invention.

In the second and third embodiments, priorities are assigned to the respective redundant word lines (redundancy match lines). The structure of the semiconductor device and the redundancy system according to the second and third embodiments will be described in other words with reference to FIG. 24A. FIG. 24A is a block diagram showing a part of the semiconductor device according to the second and third embodiments.

As shown in FIG. 24A, the semiconductor memory device 1 comprises the prime memory cell array PRIM_ARRAY, the redundant memory cell array RDNT_ARRAY and the control circuit CNT. The control circuit CNT includes the redundancy control circuit RDNT_CNT, the row decoder R/D, etc., as described above in the section of the second and third embodiments.

The redundant memory cell array RDNT_ARRAY comprises n redundant memory cell groups RDNT_GP1 to RDNT_GPn. The redundant memory cell groups are given priorities in the order from RDNT_GPn to RDNT_GP1. Each memory cell group includes redundant memory cells.

Figure 24B:
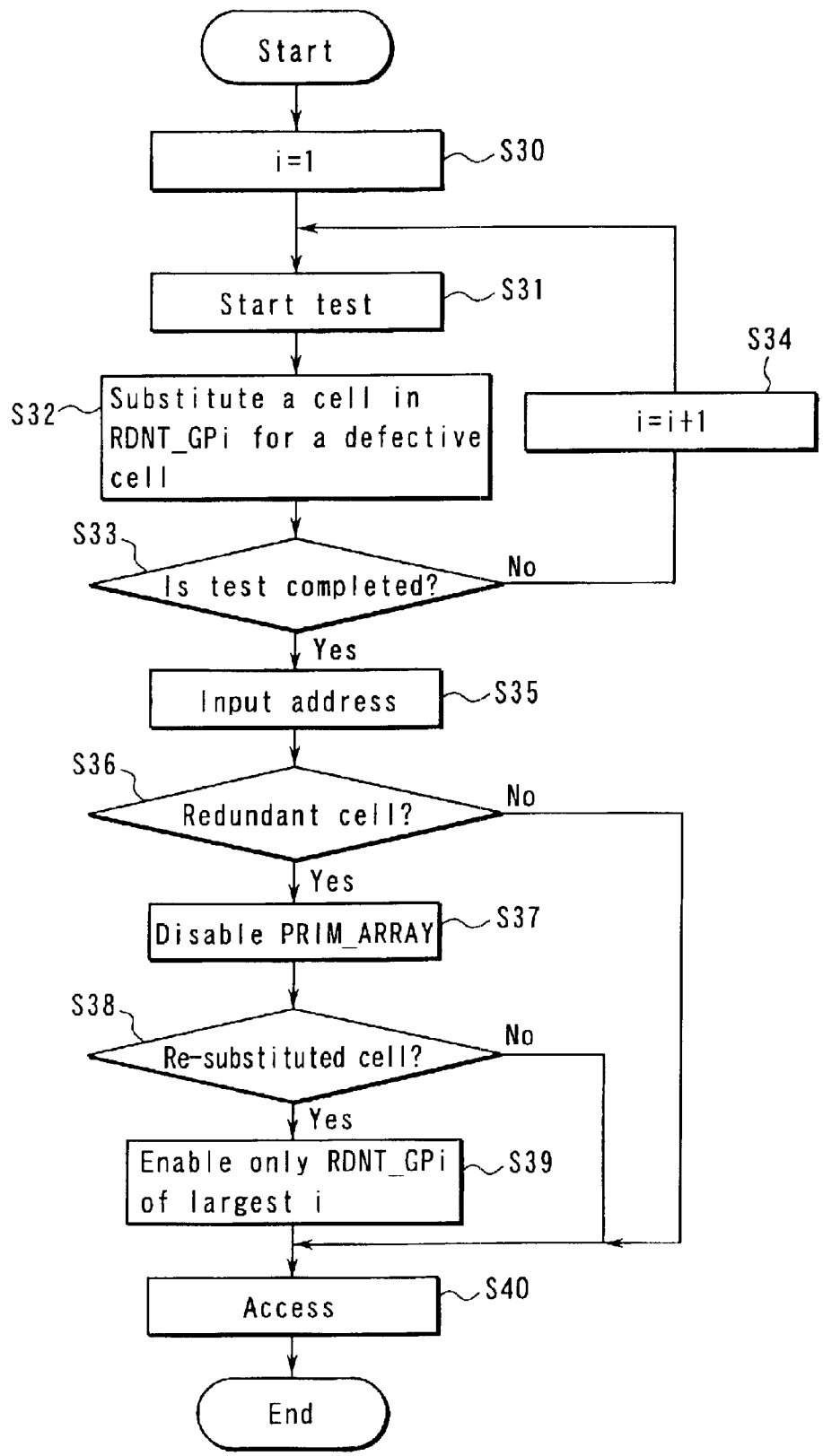
FIG. 24B is a flowchart showing a process for recovering the semiconductor device according to the second and third embodiments.

The redundancy system according to the second and third embodiments will now be described with reference to FIG. 24B. FIG. 24B is a flowchart showing a process for recovering the semiconductor device. In the chart, the symbol i indicates how many times the test is performed.

First, i is set to 1, and a first test is started (steps S30 and S31). In the test, the prime memory cell array PRIM_ARRAY is searched for a defect. If a defective memory cell is detected in the prime memory cell array PRIM_ARRAY, a redundant memory cell in the redundant memory cell group RDNT_GPi is substituted for the defective memory cell; that is, a redundant memory cell in the redundant memory cell group RDNT_GP1 is substituted for a defective memory cell detected in the first test.

If another test is to be performed (a step S33), i is incremented by 1, and a second test is started (steps S34 and S31). The second test is carried out with respect to all memory cells in the prime memory cell array PRIM_ARRAY except the defective memory cell, and the redundant memory cells in the redundant memory cell group RDNT_GP1, which includes the cell substituted for the defective memory cell in the prime memory cell array PRIM_ARRAY in the first test. If a defective memory cell is detected in the second test, a redundant memory cell in the redundant memory cell group RDN_GP2 is substituted therefor (a step S32).

If still another test is to be performed (the step S33), i is incremented by 1, and a third test is started (steps S34 and S31). The third test is carried out with respect to all memory cells in the prime memory cell array PRIM_ARRAY except the defective memory cells detected in the first and second tests, the redundant memory cells in the redundant memory cell group RDNT_GP1, which includes the cell substituted for the defective memory cell in the prime memory cell array PRIM_ARRAY in the first test, except the defective memory cell detected in the second test, and the redundant memory cells in the redundant memory cell group RDNT_GP2, which includes the cells substituted for the defective memory cells in the prime memory cell array PRIM_ARRAY and the redundant memory cell group RDNT_GP1 in the second test. If a defective memory cell is detected in the third test, a redundant memory cell in the redundant memory cell group RDNT_GP3 is substituted therefor (the step S32).

In this manner, a cell in the redundant memory cell group RDNT_GPi is substituted for a defective memory cell detected in the i-th test. This process can be repeated n times, i.e., the number of the redundant memory cell groups RDNT_GP.

When the test is completed (the step S33), a memory cell address is externally input (a step S35). If the address does not correspond to a redundant memory cell, i.e., no redundant memory cell has been substituted for the prime memory cell, the prime memory cell corresponding to the address is accessed (a step S40).

If a redundant memory cell has been substituted for the prime memory cell corresponding to the address, the control circuit CNT disables the prime memory cell array PRIM_ARRAY. In other words, access to the prime memory cell array PRIM_ARRAY is inhibited. Then, it is determined whether the address corresponds to a redundant memory cell that has been re-substituted. Re-substitution means that a plurality of redundant memory cells are substituted for a prime memory cell. If re-substitution has not been made, the only one redundant memory cell corresponding to the address is accessed (the step S40). If re-substitution has been made, only the redundant memory cell in the redundant memory cell group RNDT_GP of the largest i of all redundant memory cells corresponding to the address is enabled (a step S39), and the enabled redundant memory cell is accessed (the step S40). For example, assume that a first redundant memory cell in the redundant memory cell group RDNT_GP1 is substituted for a prime memory cell, then a second redundant memory cell in the redundant memory cell group RDNT_GP2 is substituted for the first redundant memory cell, next a third redundant memory cell in the redundant memory cell group RDNT_GP3 is substituted for the second redundant memory cell, and still another redundant memory cell in the redundant memory cell group RDNT_GP5 is substituted for the third redundant memory cell. In this case, the redundant memory cells in the redundant memory cell groups RDNT_1 to RDNT_3 corresponding to the address are disabled. Only the redundant memory cell in the redundant memory cell group RNDT_5 corresponding to the address is enabled.

In the specific process in the step S35 and the subsequent steps, according to the second embodiment of the present invention, the defective address corresponding to the redundant word line of the higher priority is compared with the defective address corresponding to the redundant word line of the lower priority. Then, access to the redundant word line having the address that matches with the defective address corresponding to the redundant word line of the higher priority is inhibited. Thus, multi-selection of redundant word lines is suppressed.

According to the third embodiment of the present invention, when the substitution command is output to a redundant word line of the higher priority, the substitution command output to a redundant word line of the lower priority is disabled, so that access to the redundant word line of the lower priority is inhibited. Thus, multi-selection of redundant word lines is suppressed.

In the second and third embodiments, the redundant word lines of the higher priority are used exclusively to the second and subsequent tests. However, all redundant word lines may be used in the first test. In this case, if all redundant word lines are used up, the redundant word lines cannot be used for re-substitution in the second and subsequent tests. However, if all redundant word lines are not used up, the remaining redundant word lines of the higher priority can be used in the second and subsequent tests, thereby improving the recovery efficiency.

In the substitution method of the embodiments described above, a redundant word line of the higher priority is substituted for a redundant word line of the lower priority. Therefore, one or more redundant word lines may be skipped. The skip will be described more specifically with reference to FIG. 23C.

Assume that a defect is detected in the first test and the redundant word line RWL0 is substituted for the defective line. Then, it is assumed that a defect is detected in the second test and the redundant word line RWL2 is substituted for the defective line, and a defect is detected in the third test and the redundant word line RWL4 is substituted for the defective line. In this case, the redundant word line RWL2 is used subsequent to the redundant word line RWL0; that is, the redundant word line RWL1 is skipped. The redundant word line RWL4 is used subsequent to the redundant word line RWL2; that is, the redundant word line RWL3 is skipped.

The embodiments of the present invention are applied to a semiconductor memory device, for example. More specifically, the embodiment can be applied to all types of memories, such as a DRAM, a SRAM (Static Random Access Memory) and MRAM (Magneto-resistive Random access Memory). The embodiment of the present invention is not limited to a semiconductor memory device but any types of semiconductor devices using a redundancy technique.

In the above embodiments, the prime memory cell array PRIM_ARRAY and the redundant memory cell array RDNT_ARRAY are treated as completely distinct arrays. However, the prime memory cells and the redundant memory cells may be located in the same cell array. This is because the term "redundant memory cell" merely means a cell that is not activated when all memory cells function normally. Further, the term "redundant memory cell" includes a memory cell, a word line, a bit line, a memory block, etc. Therefore, the substitution of word lines has been described as an example of the embodiments; however, memory cells, bit lines and memory blocks may be substituted instead of word lines.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a prime memory cell array including prime memory cells arranged in a matrix;
   a redundant memory cell array including redundant memory cells arranged in a matrix;
   a holding circuit which holds an address of a defective memory cell included in the prime memory cell array;
   a group of access lines respectively connected to the redundant memory cells;
   a first controlling circuit which supplies a substitution command to substitute a redundant memory cell for the defective memory cell corresponding to the address held in the holding circuit, through the group of access lines to the defective memory cell; and
   a second controlling circuit which, when a plurality of portions of the holding circuit hold the address of the defective memory cell, disables all but one of said plurality of portions which hold the address of the defective memory cell.

2. The semiconductor device according to claim 1, wherein:
   the holding circuit comprises a first holding part and a plurality of second holding parts, which respectively hold addresses of defective memory cells;
   the group of access lines comprises first and second access lines respectively associated with the first and second holding parts;
   the first controlling circuit supplies substitution commands to substitute redundant memory cells for the defective memory cells corresponding to the addresses held in the first and second holding parts, through the first and second access lines to the defective memory cells; and
   the second controlling circuit comprises:
   a comparing circuit which compares the address of the detective memory cell held in the first holding part with the addresses of the defective memory cells held in the second holding parts; and
   a disable circuit which disables the substitution command supplied through the second access line associated with the second holding part holding the address of the defective memory cell that is equal to the address of the defective memory cell held in the first holding part.

3. The semiconductor device according to claim 1, wherein:
   the holding circuit comprises a first holding part and a plurality of second holding parts, which respectively hold addresses of defective memory cells;
   the group of access lines comprises first and second access lines respectively associated with the first and second holding parts;
   the first controlling circuit supplies substitution commands to substitute redundant memory cells for the defective memory cells corresponding to the addresses held in the first and second holding parts, through the first and second access lines to the defective memory cells; and
   the second controlling circuit comprises:
   a first detecting circuit which monitors the first and second access lines and detects whether the substitution commands are supplied through the first and second access lines; and
   a disable circuit which disables all substitution commands supplied through the second access line, when the first detecting circuit detects that the substitution commands are supplied through both the first and second access lines.

4. The semiconductor device according to claim 2, further comprising:
   a first detecting circuit which monitors the first and second access lines and detects whether the substitution command is supplied through any of the first and second access lines;
   a first selecting circuit which is disabled when the first detecting circuit detects the substitution command, and which is enabled when the first detecting circuit dose not detect the substitution command, and selects one of the prime memory cells of the prime memory cell array; and
   a second selecting circuit which is enabled when the first detecting circuit detects the substitution command, and selects one of the redundant memory cells of the redundant memory cell array in accordance with the substitution command, and which is disabled when the first detecting circuit does not detect the substitution command.

5. The semiconductor device according to claim 3, further comprising:
   a second detecting circuit which monitors the first and second access lines and detects whether the substitution command is supplied through any of the first and second access lines;
   a first selecting circuit which is disabled when the second detecting circuit detects the substitution command, and which is enabled when the second detecting circuit dose not detect the substitution command, and selects one of the prime memory cells of the prime memory cell array; and
   a second selecting circuit which is enabled when the second detecting circuit detects the substitution command, and selects one of the redundant memory cells of the redundant memory cell array in accordance with the substitution command, and which is disabled when the second detecting circuit does not detect the substitution command.

6. The semiconductor device according to claim 2, wherein each of the first and second holding parts includes a non-rewritable and non-erasable element.

7. The semiconductor device according to claim 3, wherein each of the first and second holding parts includes a non-rewritable and non-erasable element.

8. A semiconductor device comprising:
a prime memory cell array including prime memory cells arranged in a matrix;
a redundant memory cell array including redundant memory cells respectively assigned priorities and arranged in a matrix;
a selecting circuit which selects one of the prime memory cells and one of the redundant memory cells;
a first controlling circuit which holds addresses of defective memory cells included in the prime memory cell array in correspondence with the redundant memory cells, and commands the selecting circuit to select a redundant memory cell corresponding to a defective memory cell accessed; and
a second controlling circuit which, when a plurality of portions of the first controlling circuit hold the address of the accessed defective memory cell, disables all but one of the redundant memory cells corresponding to the address of the defective memory cell in accordance with the priorities.

9. The semiconductor device according to claim 8, wherein the first controlling circuit comprises:
holding circuits which hold the addresses of the defective memory cells;
a first comparing circuit which compares the addresses of the defective memory cells held in the holding circuits with an input address; and
a substituting circuit which commands the selecting circuit to select the redundant memory cell corresponding to the defective memory cell from the redundant cell array, when the input address is equal to one of the addresses of the defective memory cells as a result of comparison in the first comparing circuit, and which commands the selecting circuit to select the prime memory cell corresponding to the input address from the prime memory cell array, when the input address is not equal to any of the addresses of the defective memory cells, and
the second controlling circuit comprises:
a second comparing circuit which compares the addresses of the defective memory cells held in the holding circuits with each other; and
a disable circuit which, if comparison result in the second comparing circuit shows that the address of the defective memory cell is held in holding circuits, disables all redundant memory cells corresponding to the address of the defective memory cell except the redundant memory cell of highest priority.

10. The semiconductor device according to claim 8, wherein the first controlling circuit comprises:
holding circuits which hold the addresses of the defective memory cells;
a first comparing circuit which compares the addresses of the defective memory cells held in the holding circuits with an input address; and
a substituting circuit which commands the selecting circuit to select the redundant memory cell corresponding to the defective memory cell from the redundant cell array, when the input address is equal to one of the addresses of the defective memory cells as a result of comparison in the first comparing circuit, and which commands the selecting circuit to select the prime memory cell corresponding to the input address from the prime memory cell array, when the input address is not equal to any of the addresses of the defective memory cells, and
the second controlling circuit which, if the substituting circuit commands the selecting circuit to select redundant memory cells, commands the selecting circuit to select one of the redundant memory cells of highest priority.

11. A semiconductor device comprising:
a prime memory cell array including prime memory cells arranged in a matrix;
a redundant memory cell array including redundant memory cells arranged in a matrix;
access lines respectively connected to the redundant memory cells and respectively assigned priorities;
holding circuits, respectively connected to the access lines, which respectively hold addresses of defective memory cells included in the prime memory cell array;
first controlling circuits respectively connected to the access lines, which outputs a control signal to an access line connected to one of the holding circuits that holds an address of a defective memory cell that is equal to an input address;
a second controlling circuit which disables all but one of the access lines corresponding to the holding circuit holding the address of the defective memory cell that is equal to the input address in accordance with the priorities;
a first selecting circuit which selects one of the prime memory cells from the prime memory cell array based on the input address; and
a second selecting circuit which selects one of the redundant memory cells from the redundant memory cell array based on the control signal output to the access line.

12. The semiconductor device according to claim 11, wherein the second controlling circuit compares an address of a defective memory cell held in one of the holding circuits corresponding to an access line of higher priority with addresses of defective memory cells held in the holding circuits corresponding to access lines of lower priority, and if the addresses are equal to each other, enables one of the first controlling circuits corresponding to the access line of the higher priority and disables all other first controlling circuits.

13. The semiconductor device according to claim 11, wherein the second controlling circuit monitors the control signal each of the first controlling circuit outputs, and when a plurality of the first controlling circuits output the control signal to the access lines, enables one of the access lines of higher priority and disables all other access lines.

14. The semiconductor device according to claim 11, further comprising a determining circuit which determines whether the control signal is output to any of the access lines and disables the first selecting circuit if the control signal is output.

15. The semiconductor device according to claim 11, wherein each of the holding circuits includes a non-rewritable and non-erasable element.

16. A semiconductor device comprising:
prime memory cells included in a prime memory cell array;
a first redundant memory cell included in a first redundant memory cell group in a redundant memory cell array and substituted for a defective memory cell included in the prime memory cell array;
a second redundant memory cell included in a second redundant memory cell group in the redundant memory cell array and substituted for the defective memory cell included in the prime memory cell array and a first defective redundant memory cell included in the first redundant memory cell group; and a controlling circuit which disables access to the first defective redundant memory cell replaced by the second redundant memory cell and to the defective memory cell replaced by the first redundant memory cell, when the second redundant memory cell is accessed.

* * * * *